US012813347B2

(12) United States Patent
Ye et al.

(10) Patent No.: US 12,813,347 B2
(45) Date of Patent: Nov. 24, 2026

(54) LOAD SWITCH MOUNTING FOR A SEMICONDUCTOR PACKAGE

(71) Applicant: Micron Technology, Inc., Boise, ID (US)

(72) Inventors: Seng Kim Ye, Singapore (SG); Hong Wan Ng, Singapore (SG); Kelvin Aik Boo Tan, Singapore (SG); See Hiong Leow, Singapore (SG); Ling Pan, Singapore (SG)

(73) Assignee: Micron Technology, Inc., Boise, ID (US)

( * ) Notice: Subject to any disclaimer, the term of this patent is extended or adjusted under 35 U.S.C. 154(b) by 389 days.

(21) Appl. No.: 18/503,560

(22) Filed: Nov. 7, 2023

(65) Prior Publication Data

US 2024/0162206 A1 May 16, 2024

Related U.S. Application Data

(60) Provisional application No. 63/383,117, filed on Nov. 10, 2022.

(51) Int. Cl.
*H10W 90/00* (2026.01)
*H10B 80/00* (2026.01)
(Continued)

(52) U.S. Cl.
CPC ............ *H10W 90/00* (2026.01); *H10B 80/00* (2023.02); *H10W 72/072* (2026.01); *H10W 72/073* (2026.01); *H10W 72/075* (2026.01); *H10W 72/252* (2026.01); *H10W 72/354* (2026.01); *H10W 72/884* (2026.01);
(Continued)

(58) Field of Classification Search
CPC . H10W 90/00; H10W 72/072; H10W 72/073; H10W 72/075; H10W 72/252; H10W 72/354; H10W 72/884; H10W 72/952; H10W 74/15; H10W 90/724;
(Continued)

(56) References Cited

U.S. PATENT DOCUMENTS

| | | | | |
|---|---|---|---|---|
| 2008/0099925 A1* | 5/2008 | Irsigler | ............. | H10W 72/0112 257/E21.503 |
| 2012/0018884 A1* | 1/2012 | Lin | ...................... | H10W 74/111 257/E23.021 |

(Continued)

*Primary Examiner* — Jay C Kim
*Assistant Examiner* — Woo K Lee
(74) *Attorney, Agent, or Firm* — Harrity & Harrity, LLP

(57) ABSTRACT

Implementations described herein relate to various semiconductor device assemblies. In some implementations, a semiconductor device assembly may include a substrate and multiple first electrical contacts disposed on the substrate. The semiconductor device assembly may include a load switch coupled to the substrate and including a first outer surface facing the substrate and an opposing second outer surface facing away from the substrate. The load switch may include multiple second electrical contacts disposed on the second outer surface. The semiconductor device assembly may include multiple wire bonds electrically coupling the load switch to the substrate, wherein each wire bond electrically couples a corresponding first electrical contact, of the multiple first electrical contacts, to a corresponding second electrical contact, of the multiple second electrical contacts.

35 Claims, 22 Drawing Sheets

(51) Int. Cl.

| | |
|---|---|
| ***H10W 72/00*** | (2026.01) |
| ***H10W 72/20*** | (2026.01) |
| ***H10W 72/30*** | (2026.01) |
| ***H10W 72/90*** | (2026.01) |
| ***H10W 74/15*** | (2026.01) |

(52) U.S. Cl.
CPC .......... *H10W 72/952* (2026.01); *H10W 74/15* (2026.01); *H10W 90/724* (2026.01); *H10W 90/734* (2026.01); *H10W 90/754* (2026.01)

(58) Field of Classification Search
CPC ... H10W 90/734; H10W 90/754; H10B 80/00
See application file for complete search history.

(56) References Cited

U.S. PATENT DOCUMENTS

| | | | | |
|---|---|---|---|---|
| 2016/0240227 | A1* | 8/2016 | Cyr | G11C 5/025 |
| 2018/0286847 | A1* | 10/2018 | Chen | H10P 54/00 |
| 2020/0096558 | A1* | 3/2020 | Ide | G01R 31/2853 |

* cited by examiner

LOAD SWITCH MOUNTING FOR A SEMICONDUCTOR PACKAGE

CROSS REFERENCE TO RELATED APPLICATION

This Patent Application claims priority to U.S. Provisional Patent Application No. 63/383,117, filed on Nov. 10, 2022, and entitled “LOAD SWITCH MOUNTING FOR A SEMICONDUCTOR PACKAGE.” The disclosure of the prior Application is considered part of and is incorporated by reference into this Patent Application.

TECHNICAL FIELD

The present disclosure generally relates to semiconductor devices and methods of forming semiconductor devices. For example, the present disclosure relates to load switch mounting for a semiconductor package.

BACKGROUND

A semiconductor package includes a casing that contains one or more semiconductor devices, such as integrated circuits. Semiconductor device components may be fabricated on semiconductor wafers before being diced into die and then packaged. A semiconductor package protects internal components from damage and includes means for connecting internal components to external components (e.g., a circuit board), such as via balls, pins, or leads. A semiconductor package is sometimes referred to as a semiconductor device assembly.

DETAILED DESCRIPTION

Figure 1:
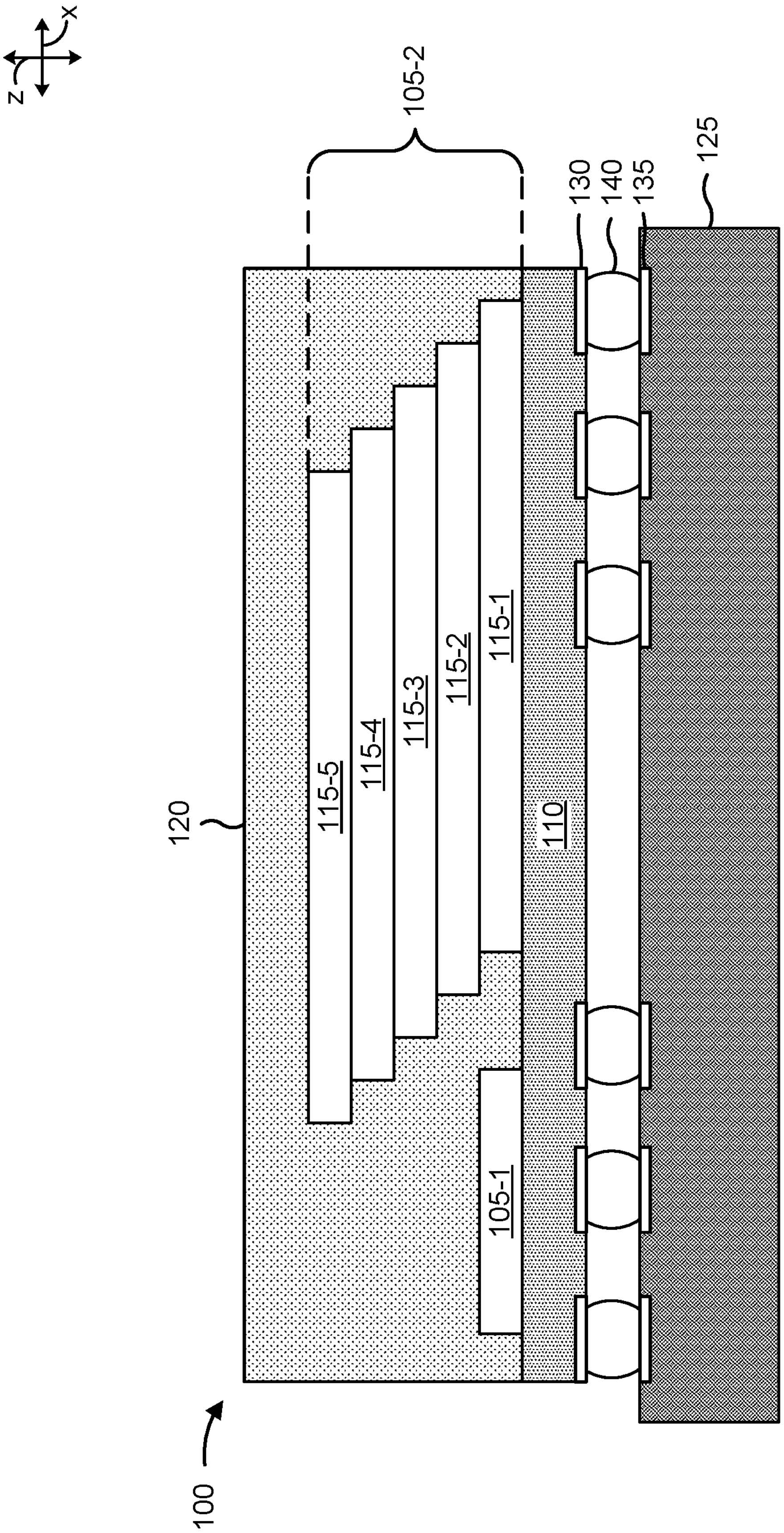
FIG. 1 is a diagram of an example apparatus that may be manufactured using techniques described herein.

Memory packages or other semiconductor packages may internally include one or more semiconductor dies, such as a controller, memory dies, or similar dies, as well as other electrical components, such as one or more capacitors, resistors, or similar electrical components. In some examples, memory packages may include a load switch. A load switch may be an electrical component used to control current flow within a semiconductor device. Put another way, a load switch may be an electrical component that is used to turn on and off power supply rails in an electrical system. For example, a load switch may be capable of switching between an OFF position, in which no current travels through the load switch and/or to associated electrical components (e.g., loads) of the electrical system (e.g., a position in which current is not permitted to travel from an input pin of the load switch to an output pin of the load switch), and an ON position, in which a current is permitted to travel through the load switch and thus to the associated electrical components (e.g., loads) of the electrical system (e.g., a position in which current is permitted to travel from an input pin of the load switch to an output pin of the load switch). A load switch may be used to selectively provide current to certain components within a semiconductor package, such as a capacitor, a resistor, or a similar electrical component within the semiconductor package. In some examples, a load switch may be used for purposes of power-distribution control within a semiconductor package; power-sequencing control during a controller start-up and/or power-down procedure, or a similar procedure; reduction in leakage current to sub-systems within a semiconductor package when not in use; inrush current control within a semiconductor package; protection features such as reverse-current protection, ON pin hysteresis, current limiting, undervoltage lock-out, over-temperature protection, or a similar protection feature; among other uses. In some examples, a load switch may be mounted within a semiconductor package, such as to a substrate within a memory package or a similar semiconductor package. In some other examples, a load switch may be mounted external to a semiconductor package, such as to a substrate (e.g., a printed circuit board (PCB)) to which a memory package or a similar semiconductor package is also mounted.

Moreover, in some examples, the load switch may be coupled to a substrate via solder paste. For example, when bonding a load switch to a substrate, electrical contacts of the load switch (e.g., pads, terminals, or similar electrical contacts) may be aligned with corresponding electrical contacts on the substrate (e.g., pads, terminals, or similar electrical contacts), with a layer of solder paste applied between the corresponding electrical contacts, thereby creating an electrical bond and mechanically coupling the load switch to the substrate. In such examples, due to the relatively weak mechanical bond formed by the solder paste, the load switch may be susceptible to loosening and/or decoupling (sometimes referred to herein as delaminating), thereby resulting in faulty performance of the load switch and/or the associated semiconductor package. Additionally, or alternatively, due to the use of the solder paste or a similar attachment mechanism, the load switch may be associated with a relatively low standoff between the load switch and the substrate (e.g., a small spacing between load switch and the substrate). Accordingly, for implementations in which a mold compound or a similar filler is placed between the load switch and the substrate (e.g., for implementations in which the load switch is mounted internal to a semiconductor package and/or encapsulated in a mold compound or other filler material as part of a package manufacturing process), there may be an incomplete fill risk because the mold compound or other filler material may not fully penetrate the spacing between the load switch and the substrate. This may result in delamination of the load switch or other faulty performance of the load switch due to the void left between the load switch and substrate.

Some implementations described herein enable an improved bond between a load switch and a substrate, resulting in decreased delamination risk and otherwise more reliable performance of the load switch. In some implementations, a load switch may be coupled to a substrate via an adhesive layer (e.g., a die attach film (DAF)), with electrical contacts of the load switch facing away from the substrate and coupled to corresponding electrical contacts on the substrate via a plurality of wire bonds. This may result in improved adhesion between the load switch and the substrate due to the presence of the adhesive layer and/or may eliminate an incomplete mold fill issue by eliminating a standoff associated with the load switch (e.g., by eliminating a spacing between the load switch and the substrate). In some other implementations, a load switch may be coupled to a substrate via a plurality of pillar interconnects, which may increase a standoff associated with the load switch. As a result, a filler material (e.g., an underfill material, a mold compound, or a similar filler material) may more readily be provided between the load switch and the substrate, thereby resulting in improved adhesion between the load switch and the substrate and/or elimination of an incomplete mold fill issue and an associated delamination risk. These and other features of the various implementations may be more readily understood with reference to FIGS. 1-12, described in more detail below.

FIG. 1 is a diagram of an example apparatus 100 that may be manufactured using techniques described herein. In FIG. 1 and the following figures, each of the illustrated x-axis, y-axis, and z-axis is substantially perpendicular to the other two axes. In other words, the x-axis is substantially perpendicular to the y-axis and the z-axis, the y-axis is substantially perpendicular to the x-axis and the z-axis, and the z-axis is substantially perpendicular to the x-axis and the y-axis. In some cases, a single reference number is shown to refer to a surface, or fewer than all instances of a part may be labeled with all surfaces of that part. All instances of the part may include associated surfaces of that part despite not every surface being labeled.

The apparatus 100 may include any type of device or system that includes one or more integrated circuits 105. For example, the apparatus 100 may include a memory device, a flash memory device, a NAND memory device, a NOR memory device, a random access memory (RAM) device, a read-only memory (ROM) device, a dynamic RAM (DRAM) device, a static RAM (SRAM) device, a synchronous dynamic RAM (SDRAM) device, a ferroelectric RAM (FeRAM) device, a magnetic RAM (MRAM) device, a resistive RAM (RRAM) device, a holographic RAM (HRAM) device, a solid state drive (SSD), a microchip, and/or a system on a chip (SoC), among other examples. In some cases, the apparatus 100 may be referred to as a semiconductor package, an assembly, a semiconductor device assembly, or an integrated assembly.

As shown in FIG. 1, the apparatus 100 may include one or more integrated circuits 105, shown as a first integrated circuit 105-1 and a second integrated circuit 105-2, disposed on a substrate 110. An integrated circuit 105 may include any type of circuit, such as an analog circuit, a digital circuit, a radiofrequency (RF) circuit, a power supply, an input-output (I/O) chip, an application-specific integrated circuit (ASIC), a field-programmable gate array (FPGA), and/or a memory device (e.g., a NAND memory device, a NOR memory device, a RAM device, or a ROM device). An integrated circuit 105 may be mounted on or otherwise disposed on a surface of the substrate 110. Although the apparatus 100 is shown as including two integrated circuits 105 as an example, the apparatus 100 may include a different number of integrated circuits 105.

In some implementations, an integrated circuit 105 may include multiple semiconductor dies 115 (sometimes called dies), shown as five semiconductor dies 115-1 through 115-5. As shown in FIG. 1, the dies 115 may be stacked on top of each other to reduce a footprint of the apparatus 100. The stacked dies 115 may include three-dimensional electrical interconnects, such as through-silicon vias (TSVs), to route electrical signals between dies 115. Although the integrated circuit 105-2 is shown as including five dies 115, an integrated circuit 105 may include a different number of dies 115 (e.g., at least two dies 115). A first die 115-1 (sometimes called a bottom die or a base die) may be disposed on the substrate 110, a second die 115-2 may be disposed on the first die 115-1, and so on.

The apparatus 100 may include a casing 120 that protects internal components of the apparatus 100 (e.g., the integrated circuits 105) from damage and environmental elements (e.g., particles) that can lead to malfunction of the apparatus 100. The casing 120 may be a plastic (e.g., an epoxy plastic), a ceramic, or another type of material depending on the functional requirements for the apparatus 100. In some aspects, the casing may be associated with a mold compound that surrounds, encloses, and/or encapsulates the various internal components of the apparatus 100 (e.g., the integrated circuits 105 and/or similar electrical components) during a compression molding process or similar encapsulation process.

In some implementations, the apparatus 100 may be included as part of a higher level system (e.g., a computer, a mobile phone, a network device, an SSD, a vehicle, or an Internet of Things device), such as by electrically connecting the apparatus 100 to a circuit board 125, such as a printed circuit board. For example, the substrate 110 may be disposed on the circuit board 125 such that electrical contacts 130 (e.g., bond pads) of the substrate 110 are electrically connected to electrical contacts 135 (e.g., bond pads) of the circuit board 125.

In some implementations, the substrate 110 may be mounted on the circuit board 125 using solder balls 140 (e.g., arranged in a ball grid array), which may be melted to form a physical and electrical connection between the substrate 110 and the circuit board 125. Additionally, or alternatively, the substrate 110 may be mounted on and/or electrically connected to the circuit board 125 using another type of connector, such as pins or leads. Similarly, an integrated circuit 105 may include electrical pads (e.g., bond pads) that are electrically connected to corresponding electrical pads (e.g., bond pads) of the substrate 110 using electrical bonding, such as wire bonding, bump bonding, or the like. The interconnections between an integrated circuit 105, the substrate 110, and the circuit board 125 enable the integrated circuit 105 to receive and transmit signals to other components of the apparatus 100 and/or the higher level system.

As indicated above, FIG. 1 is provided as an example. Other examples may differ from what is described with regard to FIG. 1.

Figure 2:
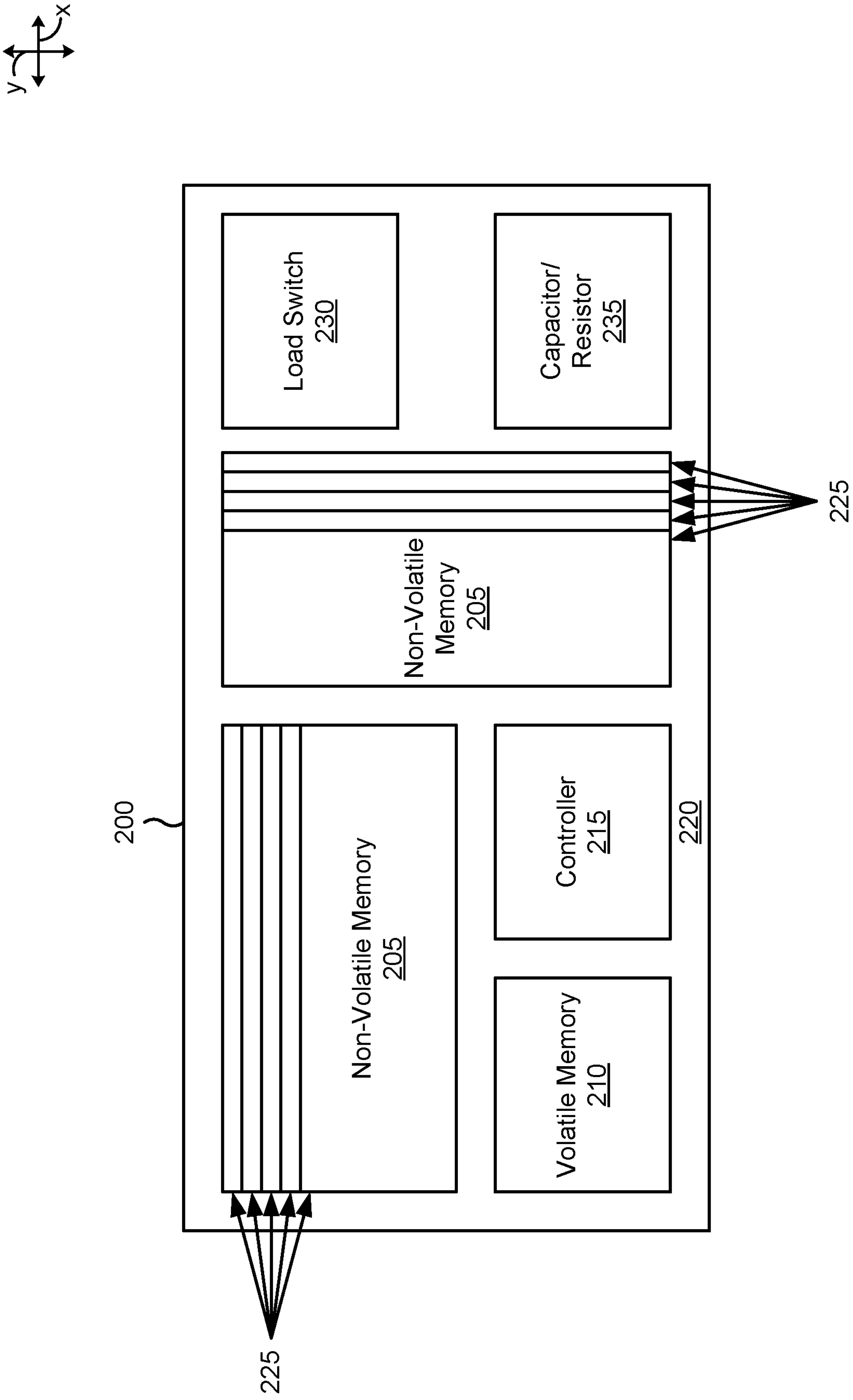
FIG. 2 is a diagram of an example memory device that may be manufactured using techniques described herein.

FIG. 2 is a diagram of an example memory device 200 that may be manufactured using techniques described herein. The memory device 200 is an example of the apparatus 100 described above in connection with FIG. 1. The memory device 200 may be any electronic device configured to store data in memory. In some implementations, the memory device 200 may be an electronic device configured to store data persistently in non-volatile memory 205. For example, the memory device 200 may be a hard drive, an SSD, a flash memory device (e.g., a NAND flash memory device or a NOR flash memory device), a universal serial bus (USB) thumb drive, a memory card (e.g., a secure digital (SD) card), a secondary storage device, a non-volatile memory express (NVMe) device, and/or an embedded multimedia card (eMMC) device. In some examples, the memory device 200 may be associated with a RAM device, a ROM device, a DRAM device, an SRAM device, an SDRAM device, an FeRAM device, an MRAM device, an RRAM device, an HRAM device, and/or a flash memory device (e.g., a NAND memory device or a NOR memory memory), among other examples.

As shown, the memory device 200 may include non-volatile memory 205, volatile memory 210, a controller 215, and/or other electrical components such as a load switch 230, a capacitor and/or resistor 235, and/or similar electrical components. The components of the memory device 200 may be mounted on or otherwise disposed on a substrate 220. In some implementations, the non-volatile memory 205 includes stacked semiconductor dies 225, as described above in connection with FIG. 1. In some implementations, one or more of the components of the memory device 200 may be mounted external to the memory device 200, such as on a PCB to which the memory device 200 is also attached. For example, in some aspects, the load switch 230 and/or the capacitor and/or resistor 235 may be mounted external to the memory device 200.

The non-volatile memory 205 may be configured to maintain stored data after the memory device 200 is powered off. For example, the non-volatile memory 205 may include NAND memory or NOR memory. The volatile memory 210 may require power to maintain stored data and may lose stored data after the memory device 200 is powered off. For example, the volatile memory 210 may include one or more latches and/or RAM, such as DRAM and/or SRAM. As an example, the volatile memory 210 may cache data read from or to be written to non-volatile memory 205, and/or may cache instructions to be executed by the controller 215.

The controller 215 may be any device operatively connected to, and/or configured to communicate with, the non-volatile memory 205, the volatile memory 210, and a host device (e.g., via a host interface of the memory device 200). For example, the controller 215 may include a memory controller, a system controller, an ASIC, an FPGA, a processor, a microcontroller, and/or one or more processing components. In some implementations, the memory device 200 may be included in a system that includes the host device. The host device may include one or more processors configured to execute instructions and store data in the non-volatile memory 205.

The controller 215 may be configured to control operations of the memory device 200, such as by executing one or more instructions (sometimes called commands). For example, the memory device 200 may store one or more instructions as firmware, and the controller 215 may execute those one or more instructions. Additionally, or alternatively, the controller 215 may receive one or more instructions from a host device via a host interface, and may execute those one or more instructions. For example, the controller 215 may transmit signals to and/or receive signals from the non-volatile memory 205 and/or the volatile memory 210 based on the one or more instructions, such as to transfer data to (e.g., write or program), to transfer data from (e.g., read), and/or to erase all or a portion of the non-volatile memory 205 (e.g., one or more memory cells, pages, sub-blocks, blocks, or planes of the non-volatile memory 205).

The load switch 230 may be configured to selectively supply a current to one or more electrical components (e.g., one or more loads) of the memory device 200, such as the capacitor and/or resistor 235 or one of the other components described herein. Put another way, the load switch 230 may be an electrical component that is used to turn on and off power supply rails in the memory device 200. For example, the load switch 230 may be capable of switching between an OFF position, in which no current travels through the load switch 230 and/or to associated electrical components (e.g., loads) of the memory device 200 (e.g., the non-volatile memory 205, the volatile memory 210, the controller 215, and/or other electrical components, such as the capacitor and/or resistor 235 or a similar electrical component), and an ON position, in which a current is permitted to travel through the load switch 230 and thus to the associated electrical components (e.g., loads) of the memory device 200 (e.g., the non-volatile memory 205, the volatile memory 210, the controller 215, and/or other electrical components, such as the capacitor and/or resistor 235 or a similar electrical component). As described above, the load switch 230 and/or any associated electrical components electrically coupled to the load switch 230 (e.g., the capacitor and/or the resistor 235) may be used for purposes of power-distribution control within the memory device 200; power-sequencing control during a controller 215 start-up and/or power-down procedure, or a similar procedure; reduction in leakage current to sub-systems within the memory device 200 when not in use; inrush current control within the memory device 200; protection features such as reverse-current protection, ON pin hysteresis, current limiting, undervoltage lock-out, over-temperature protection, or a similar protection feature; among other uses.

As indicated above, FIG. 2 is provided as an example. Other examples may differ from what is described with regard to FIG. 2. The number and arrangement of components shown in FIG. 2 are provided as an example. In practice, there may be additional components, fewer components, different components, or differently arranged components than those shown in FIG. 2.

Figure 3:
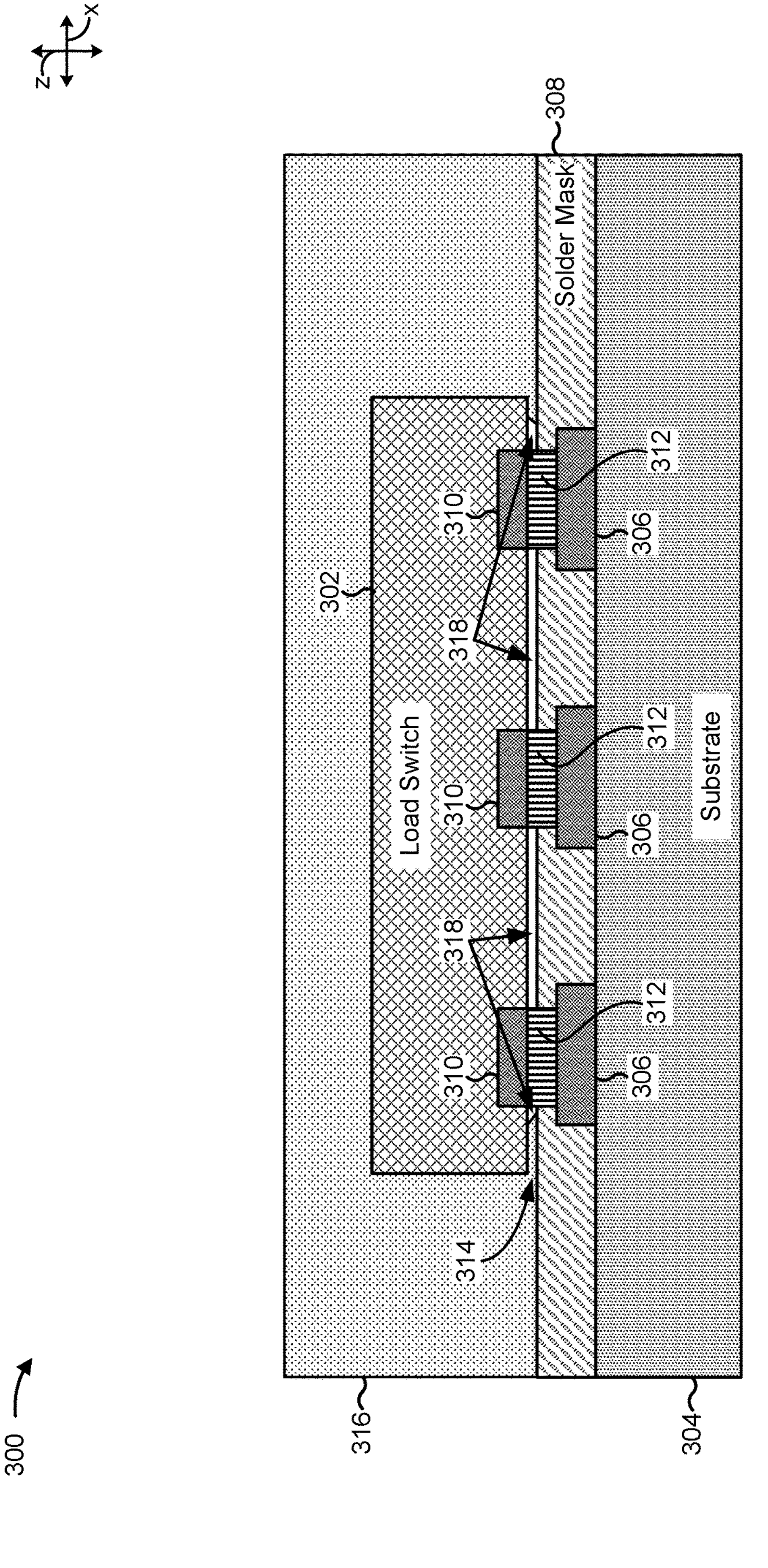
FIG. 3 is a diagram of an example apparatus (e.g., memory device) that includes a load switch bonded to a substrate.

FIG. 3 is a diagram of an example apparatus 300 (e.g., memory device 200) that includes a load switch 302 bonded to a substrate 304.

As shown in FIG. 3, the apparatus 300 may include the load switch 302 (e.g., load switch 230) bonded to the substrate 304 (e.g., substrate 220) via a plurality of corresponding electrical contacts disposed on the load switch 302 and the substrate 304. More particularly, the substrate 304 may include a plurality of electrical contacts 306, which may be pads, terminals, or similar electrical contacts configured to electrically couple to another component (e.g., the load switch 302). In some implementations, the plurality of electrical contacts 306 may be copper and/or gold pads configured to electrically couple to the load switch 302. The substrate 304 may further include a solder mask 308 disposed on an upper surface of the substrate 304, substantially surrounding the plurality of electrical contacts 306. For example, the solder mask 308 may include corresponding openings at each electrical contacts 306, thereby exposing the pad, terminal, or similar electrical contacts for bonding to another component (e.g., the load switch 302).

Similarly, the load switch 302 may include a corresponding plurality of electrical contacts 310. The plurality of electrical contacts 310 on the load switch 302 may be arranged and configured to align with the plurality of electrical contacts 306 on the substrate 304 when the load switch 302 is placed on the substrate 304, as shown in FIG. 3. The plurality of electrical contacts 310 may be pads, terminals, or similar electrical contacts configured to electrically couple to another component (e.g., the substrate 304). In some implementations, the plurality of electrical contacts 310 may be copper and/or gold pads configured to electrically couple to the substrate 304 (and, more particularly, to electrically couple to the plurality of electrical contacts 306 of the substrate 304).

In some examples, the load switch 302 may be bonded to the substrate 304 using a solder paste 312, sometimes referred to as a surface mount (SMT) bonding technique. The solder paste 312 may include a powdered solder material suspended in a flux paste. In such aspects, the tacky flux paste may hold the powdered solder material and/or the various components (e.g., the load switch 302) in place until a soldering reflow process or similar soldering process melts the solder, thereby establishing an electrical connection between two terminals (e.g., in the example depicted in FIG. 3, one of the plurality of electrical contacts 306 of the substrate 304 and a corresponding one of the plurality of electrical contacts 310 of the load switch 302) as well as forming a mechanical bond between two components (e.g., the load switch 302 and the substrate 304).

In some examples, the solder paste 312 may form a relatively weak mechanical bond between the load switch 302 and the substrate 304. Accordingly, the load switch 302 may be prone to delaminating from the substrate 304, resulting in faulty performance of the load switch 302 and/or a semiconductor package (e.g., a memory device 200) incorporating the load switch 302 or otherwise associated with the load switch 302.

Moreover, as shown in FIG. 3, the solder paste 312 may form a relatively thin (in a z-axis direction) bond between the load switch 302 and the substrate 304. As a result, the load switch 302 may be mounted near the substrate 304, creating a relatively small standoff 314 between the load switch 302 and the substrate 304 (e.g., a small spacing, in the z-axis direction, between load switch 302 and the substrate 304). This may be problematic during a compression molding process or a similar manufacturing process, because the small standoff 314 may result in an incomplete fill between the load switch 302 and the substrate 304. More particularly, in some examples, the load switch 302 and other electrical components of the apparatus 300 may be encapsulated in a mold compound 316 during a compression molding process. Due to the relatively small standoff 314 between the load switch 302 and the substrate 304, the mold compound 316 may not fully penetrate the spacing between the load switch 302 and the substrate 304, resulting in voids 318 between the load switch 302 and the substrate 304 (e.g., areas of incomplete fill between the load switch 302 and the substrate 304). These voids 318 may result in delamination of the load switch 302 within the apparatus 300, leading to faulty operation of the load switch 302 and/or the apparatus 300.

In some implementations, the delamination risk associated with a load switch may be reduced or eliminated by bonding a load switch to a substrate using a wire bond and/or a pillar interconnect. More particularly, in some implementations, a load switch may be coupled to a substrate via an adhesive layer (e.g., a DAF), with electrical contacts thereof facing away from the substrate and coupled to corresponding electrical contacts on the substrate via a plurality of wire bonds. This may result in improved adhesion between the load switch and the substrate due to the presence of the adhesive layer and/or may eliminate an incomplete mold fill issue by eliminating a standoff associated with the load switch. In some other implementations, a load switch may be coupled to a substrate via a plurality of pillar interconnects, which may increase a standoff associated with the load switch. As a result, a filler material (e.g., a mold compound or a similar filler material) may more readily penetrate a spacing between the load switch and the substrate, thereby resulting in improved adhesion between the load switch and the substrate and/or elimination of an incomplete mold fill issue and an associated delamination risk. These and other features of the various implementations may be more readily understood with reference to FIGS. 4-12, described in more detail below.

As indicated above, FIG. 3 is provided as an example. Other examples may differ from what is described with respect to FIG. 3.

Figure 4:
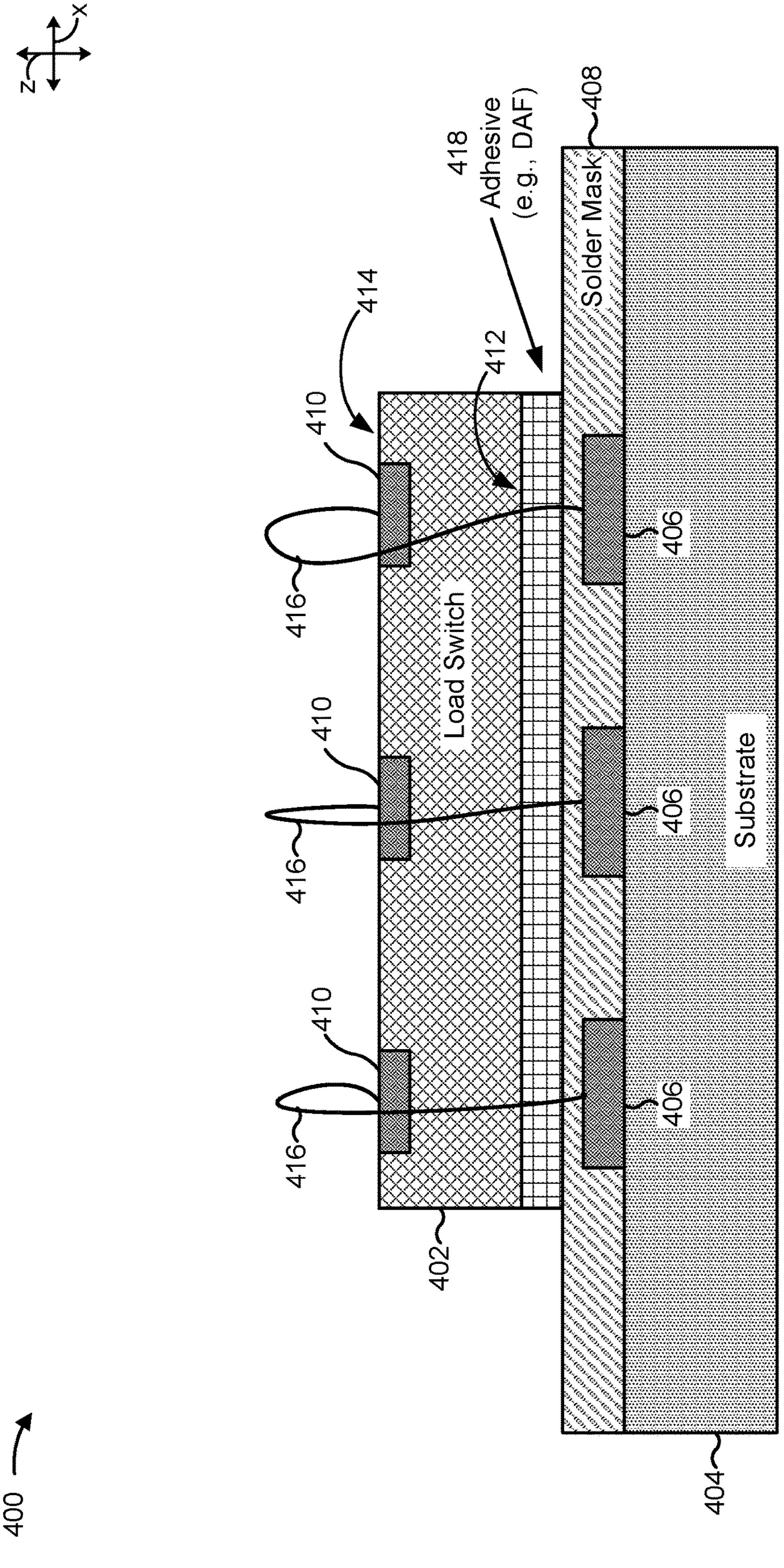
FIG. 4 is a diagram of an example apparatus (e.g., memory device) that includes a load switch bonded to a substrate.

FIG. 4 is a diagram of an example apparatus 400 (e.g., memory device 200) that includes a load switch 402 bonded to a substrate 404.

As shown in FIG. 4, the apparatus 400 may include the load switch 402 (e.g., load switch 230) bonded to the substrate 404 (e.g., substrate 220) via a plurality of corresponding electrical contacts disposed on the load switch 402 and the substrate 404. More particularly, the substrate 404 may include a plurality of electrical contacts 406, which may be pads, terminals, or similar electrical contacts configured to electrically couple to another component (e.g., the load switch 402). In some implementations, the plurality of electrical contacts 406 may be copper and/or gold pads configured to electrically couple to the load switch 402. The substrate 404 may further include a solder mask 408 disposed on an upper surface of the substrate 404, substantially surrounding the plurality of electrical contacts 406. For example, the solder mask 408 may include corresponding openings at each electrical contacts 406, thereby exposing the pad, terminal, or similar electrical contact for bonding to another component (e.g., the load switch 402).

Similarly, the load switch 402 may include a plurality of electrical contacts 410. The plurality of electrical contacts 410 may be pads, terminals, or similar electrical contacts configured to electrically couple to another component (e.g., the substrate 404). In some implementations, the plurality of electrical contacts 410 may be copper and/or gold pads configured to electrically couple to the substrate 404 (and, more particularly, to electrically couple to the plurality of electrical contacts 406 of the substrate 404).

Unlike the load switch 302 of the apparatus 300, in this implementation, the load switch 402 is not mounted on the substrate 404 with the electrical contacts 410 of the load switch 402 aligning with the electrical contacts 406 of the substrate 404. Instead, the load switch 402 may be placed on the substrate 404 such that the electrical contacts 410 face upward, in the z-axis direction (e.g., such that the electrical contacts 410 face away from the substrate 404). Put another way, the load switch 402 may include a first outer surface 412 facing the substrate 404 and an opposing second outer surface 414 facing away from the substrate 404, with the plurality of electrical contacts 410 being disposed on the second outer surface 414 (e.g., the load switch 402 is upside down compared to the mounting orientation of the load switch 302 described in connection with the apparatus 300).

Moreover, in this implementation, the load switch 402 may be bonded to the substrate 404 via a plurality of wire bonds 416. More particularly, the plurality of wire bonds 416 may electrically couple the load switch 402 to the substrate 404, with each wire bond 416 electrically coupling a corresponding electrical contact 406 of the substrate 404 to a corresponding electrical contact 410 of the load switch 402. In this way, the solder paste bonds used to bond a load switch to a substrate (as described above in connection with the solder paste 312 of apparatus 300) may be eliminated, thereby eliminating the low standoff between the load switch 402 and the substrate 404. Thus, in aspects in which the apparatus 400 is included internal to a memory package or the like (e.g., memory device 200), and/or is encapsulated in a filler material, such as a mold compound applied during a compression molding process, there is a reduced risk of incomplete fill between the load switch 402 and the substrate 404.

Moreover, in some implementations, the load switch 402 may be coupled to the substrate 404 via an adhesive layer 418. For example, the adhesive layer 418 may include a DAF coupling the load switch 402 to the substrate 404 (and, more particularly, coupling the load switch 402 to the solder mask 408 on the substrate 404). The adhesive layer 418 may further improve adhesion of the load switch 402 to the substrate 404, thereby reducing the risk of delamination or otherwise faulty performance of the load switch 402 and/or the apparatus 400 incorporating the load switch 402 (e.g., a memory package including the load switch 402). For example, in implementations in which the load switch 402 is mounted external to a memory package and/or is otherwise not encapsulated in a mold compound (which is described in more detail below in connection with FIG. 6), the adhesive layer 418 may provide improved adhesion as compared to a load switch bonded to a substrate using a solder paste (e.g., solder paste 312), thereby reducing the risk of delamination and/or faulty performance of the load switch 402.

Although the implementation described above in connection with FIG. 4 utilizes a plurality of wire bonds 416 to establish electrical connectivity between the load switch 402 and the substrate 404, in some other implementations different electrical connections may be utilized without departing from the scope of the disclosure. This may be more readily understood with reference to FIG. 5, which shows load switch bonded to a substrate using a plurality of pillar interconnects to establish electrical connectivity.

As indicated above, FIG. 4 is provided as an example. Other examples may differ from what is described with regard to FIG. 4.

Figure 5:
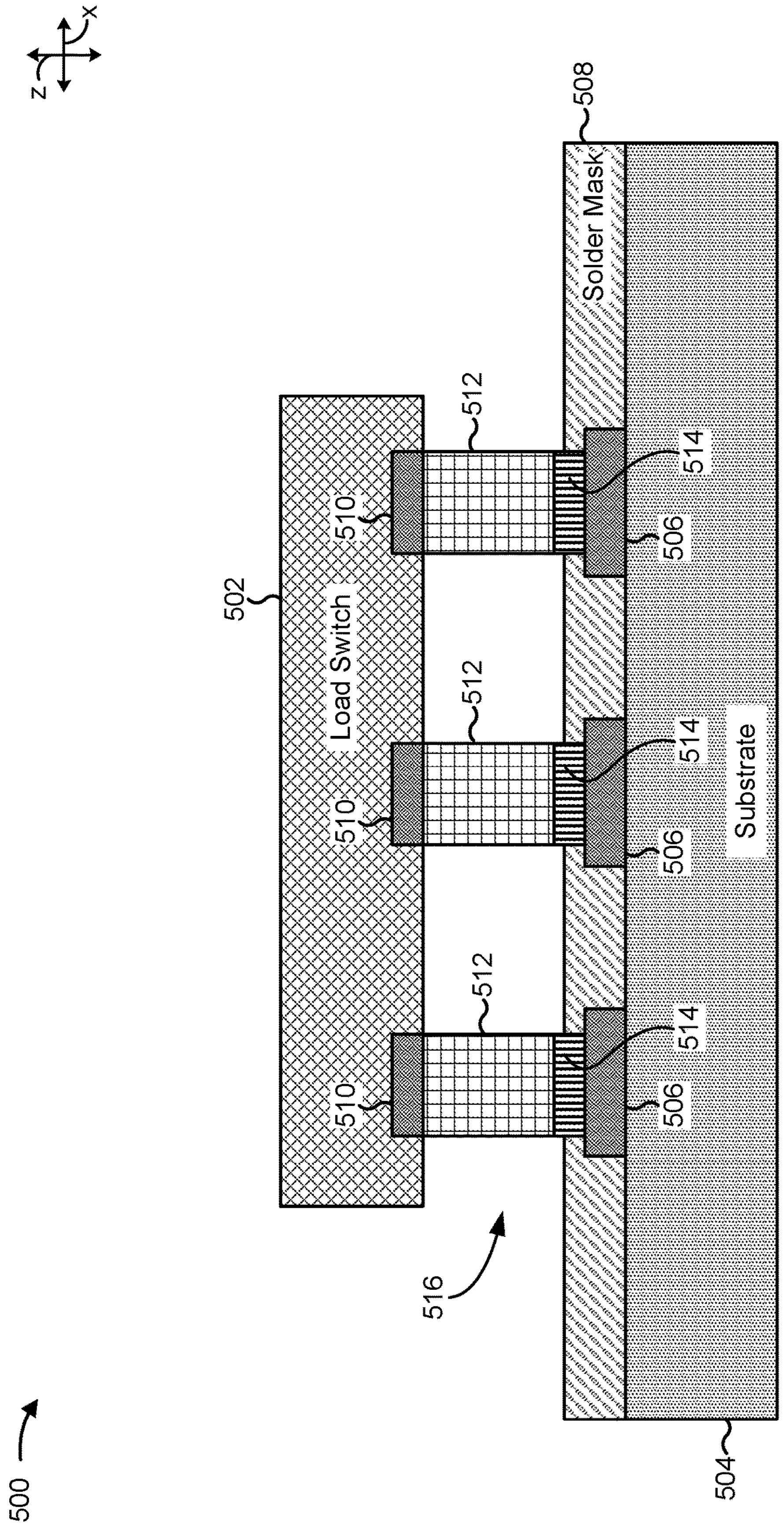
FIG. 5 is a diagram of an example apparatus (e.g., memory device) that includes a load switch bonded to a substrate.

FIG. 5 is a diagram of an example apparatus 500 (e.g., memory device 200) that includes a load switch 502 bonded to a substrate 504.

As shown in FIG. 5, the apparatus 500 may include the load switch 502 (e.g., load switch 230) bonded to the substrate 504 (e.g., substrate 220) via a plurality of corresponding electrical contacts disposed on the load switch 502 and the substrate 504. More particularly, the substrate 504 may include a plurality of electrical contacts 506, which may be pads, terminals, or similar electrical contacts configured to electrically couple to another component (e.g., the load switch 502). In some implementations, the plurality of electrical contacts 506 may be copper and/or gold pads configured to electrically couple to the load switch 502. The substrate 504 may further include a solder mask 508 disposed on an upper surface of the substrate 504, substantially surrounding the plurality of electrical contacts 506. For example, the solder mask 508 may include corresponding openings at each electrical contact 506, thereby exposing the pad, terminal, or similar electrical contact for bonding to another component (e.g., the load switch 502).

Similarly, the load switch 502 may include a plurality of electrical contacts 510. The plurality of electrical contacts 510 on the load switch 502 may be arranged and configured to align with the plurality of electrical contacts 506 on the substrate 504 when the load switch 502 is placed on the substrate 504, as shown in FIG. 5. The plurality of electrical contacts 510 may be pads, terminals, or similar electrical contacts configured to electrically couple to another component (e.g., the substrate 504). In some implementations, the plurality of electrical contacts 510 may be copper and/or gold pads configured to electrically couple to the substrate 504 (and, more particularly, to electrically couple to the plurality of electrical contacts 506 of the substrate 504).

In some implementations, the load switch 502 may further include a plurality of pillar interconnects 512. In some implementations, a pillar interconnect 512 may act as a spacer to provide a sufficient standoff between the load switch 502 and the substrate 504 such that a mold compound, an underfill material, or another filler material may sufficiently penetrate a space between the load switch 502 and the substrate 504 in order to reduce a delamination risk associated with the load switch 502*def*. In that regard, a pillar interconnect 512 may be associated with a height and/or thickness (e.g., a z-axis dimension of the pillar interconnect 512) that is larger than a width of the pillar interconnect 512 (e.g., an x-axis dimension and/or a y-axis dimension of the pillar interconnect 512). The plurality of pillar interconnects 512 may include an electrically conductive material (e.g., copper), with each pillar interconnect 512 being attached to (e.g., soldered to or otherwise electrically coupled to) a corresponding electrical contact 510 of the load switch 502. Moreover, although shown and described as two components, in some other implementations, each electrical contact 510 and pillar interconnect 512 pair may be a single, integrated component (e.g., a single copper pillar or similar component).

In some implementations, the load switch 502 may be bonded to the substrate 504 via the plurality of pillar interconnects 512. More particularly, in some implementations, the plurality of pillar interconnects 512 may electrically couple the load switch 502 to the substrate 504, with each pillar interconnect 512 electrically coupling a corresponding electrical contact 506 of the substrate 504 to a corresponding electrical contact 510 of the load switch 502. Additionally, or alternatively, the load switch 502 may be bonded to the substrate 504 by using a solder paste 514 or a similar solder material. In a similar manner as described above in connection with the solder paste 312 of FIG. 3, the solder paste 514 may include a powdered solder material suspended in a flux paste. In such aspects, the tacky flux paste may hold the powdered solder material and/or components (e.g., the load switch 502) in place until a soldering reflow process or similar soldering process melts the solder, thereby establishing an electrical and mechanical connection between two terminals (e.g., in the example depicted in FIG. 5, one of the plurality of electrical contacts 506 of the substrate 504 and a corresponding one of the plurality of the pillar interconnects 512 of the load switch 502).

In this way, the load switch 502 may be mounted relatively far from the substrate 504 (as compared to the load switch 302 described above in connection with FIG. 3), creating a relatively large standoff 516 between the load switch 502 and the substrate 504 (e.g., a large spacing, in the z-axis direction, between load switch 502 and the substrate 504). As a result, a risk of incomplete fill between the load switch 502 and the substrate 504 during a compression molding process may be reduced. More particularly, in some implementations, the load switch 502 and other electrical components of the apparatus 500 may be encapsulated in a mold compound (e.g., mold compound 316) during a compression molding process and/or may otherwise include a filler material (e.g., a mold compound, a mold underfill (MUF), a capillary underfill (e.g., an epoxy underfill), or a similar filler material) disposed between the load switch 502 and the substrate 504 and encapsulating the plurality of pillar interconnects 512. Due to the relatively large standoff 516 between the load switch 502 and the substrate 504 created by the pillar interconnects 512, the filler material may readily penetrate the spacing between the load switch 502 and the substrate 504, eliminating the voids 318 described above in connection with FIG. 3. Accordingly, delamination of the load switch 502 may be avoided, resulting in more reliable operation of the load switch 502 and/or the apparatus 500.

In some implementations, the features of the apparatus 400 and/or the features of the apparatus 500 may be employed in connection with load switches mounted internal to a semiconductor package (e.g., load switches mounted within a memory package), and, in some other implementations, the features of the apparatus 400 and/or the apparatus 500 may be employed in connection with load switches mounted external to a semiconductor package (e.g., load switches mounted on a PCB on which an associated memory package is also mounted). Implementations of mounting load switches both internal to and external to a semiconductor package are described in more detail below in connection with FIGS. 6 and 7.

As indicated above, FIG. 5 is provided as an example. Other examples may differ from what is described with regard to FIG. 5.

Figure 6:
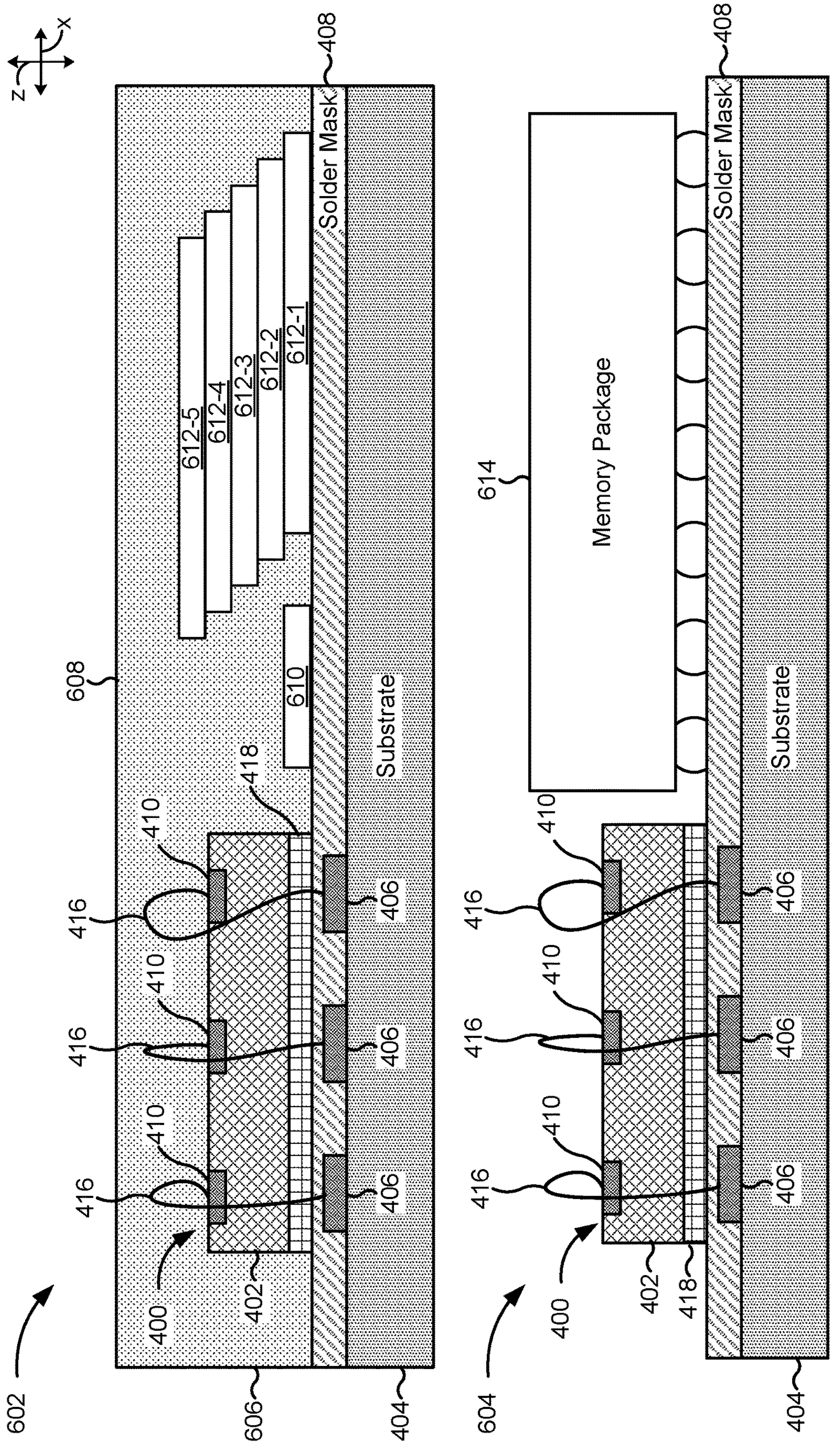
FIG. 6 shows diagrams of examples associated with semiconductor packages incorporating the apparatus of FIG. 4.

FIG. 6 shows diagrams of examples 602, 604 associated with semiconductor packages incorporating the apparatus 400 of FIG. 4.

In the example 602, the load switch 402 of the apparatus 400 may be internal to a semiconductor package 606, which may be a memory package (e.g., memory device 200) or a similar semiconductor package. In that regard, the semiconductor package 606 may include a casing 608 (e.g., casing 120) enclosing the load switch 402. In some implementations, the casing 608 may include a mold compound that is compressed around the load switch 402 during a compression molding process, or a similar process. In some implementations, the semiconductor package 606 may include other electrical components, such as one or more integrated circuits and/or semiconductor dies, that are also encapsulated by the casing 608. For example, in implementations in which the semiconductor package 606 is a memory package (e.g., memory device 200), the semiconductor package 606 may include a controller 610 (e.g., controller 215) and/or one or more memory dies 612 (e.g., non-volatile memory 205 and/or volatile memory 210). For example, in the example depicted in FIG. 6, the semiconductor package 606 includes five stacked memory dies 612, shown as a first memory die 612-1 through a fifth memory die 612-5. Accordingly, in some implementations, the casing 608 may include a mold compound that is compressed around the load switch 402, the controller 610, the memory dies 612, and/or additional electrical components (e.g., the capacitor and/or resistor 235 or similar electronic components). As shown in example 602, when the load switch 402 is mounted in this manner, the narrow standoff (e.g., standoff 314 described in connection with the apparatus 300 shown in FIG. 3) is eliminated, thereby eliminating the voids 318 that may otherwise form between the load switch 402 and the substrate 404. Instead, the load switch 402 may be affixed to the substrate 404 (e.g., affixed to the solder mask 408 of the substrate 404) via the adhesive layer 418 (e.g., a DAF), reducing the delamination risk and otherwise minimizing faulty operation of the load switch 402 and/or the semiconductor package 606.

In the example 604, the load switch 402 of the apparatus 400 may be external to a semiconductor package 614, which may be a memory package (e.g., memory device 200) or a similar semiconductor package. For example, the substrate 404 may be a PCB or similar board on which both the load switch 402 and the semiconductor package 614 are mounted, and via which the load switch 402 and the semiconductor package 614 are electrically coupled (e.g., via signal traces or similar electrical connections in the PCB). As shown in example 604, the load switch 402 may be affixed to the substrate 404 (e.g., affixed to the solder mask 408 of the substrate 404) via the adhesive layer 418 (e.g., the DAF), which may exhibit increased mechanical strength as compared to a mechanical bond formed by the solder paste 312 described above in connection with the apparatus 300 of FIG. 3. In that regard, features of the apparatus 400 may reduce the delamination risk and otherwise minimize faulty operation of the load switch 402 and/or the semiconductor package 614 when the load switch 402 is mounted external to the semiconductor package 614.

As indicated above, FIG. 6 is provided as an example. Other examples may differ from what is described with regard to FIG. 6.

Figure 7:
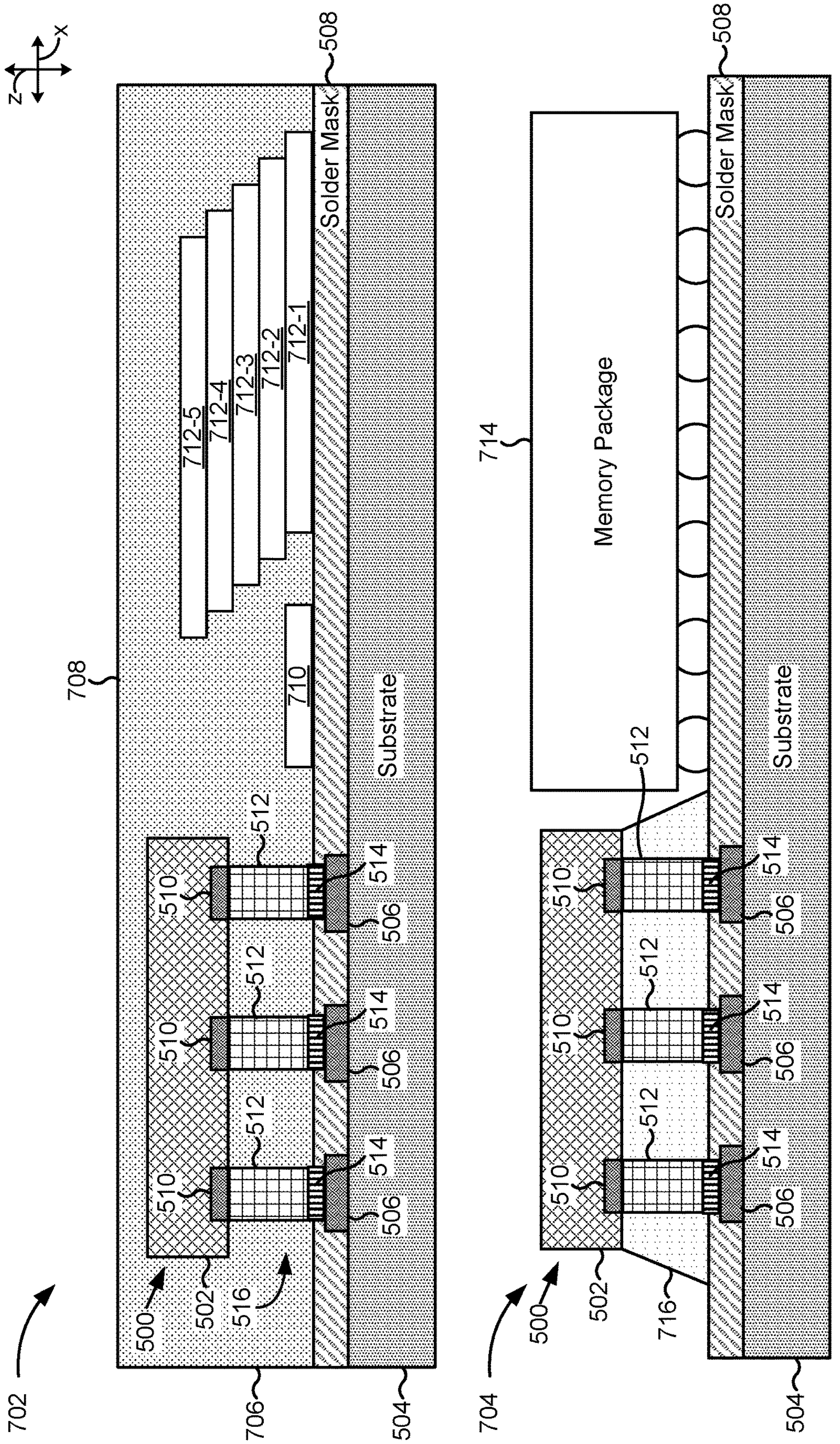
FIG. 7 shows diagrams of examples associated with semiconductor packages incorporating the apparatus of FIG. 5.

FIG. 7 shows diagrams of examples 702, 704 associated with semiconductor packages incorporating the apparatus 500 of FIG. 5.

In the example 702, the load switch 502 of the apparatus 500 may be internal to a semiconductor package 706, which may be a memory package (e.g., memory device 200) or a similar semiconductor package. In that regard, the semiconductor package 706 may include a casing 708 (e.g., casing 120) enclosing the load switch 502. In some implementations, the casing 708 may include a mold compound that is compressed around the load switch 502 during a compression molding process, or a similar process. In some implementations, the semiconductor package 706 may include other electrical components, such as one or more integrated circuits and/or semiconductor dies, that are also encapsulated in the casing 708. For example, in implementations in which the semiconductor package 706 is a memory package (e.g., memory device 200), the semiconductor package may include a controller 710 (e.g., controller 215) and/or one or more memory dies 712 (e.g., non-volatile memory 205 and/or volatile memory 210). For example, in the example depicted in FIG. 7, the semiconductor package 706 includes five stacked memory dies 712, shown as a first memory device 712-1 through a fifth memory device 712-5. Accordingly, in some implementations, the casing 708 may include a mold compound that is compressed around the load switch 502, the controller 710, the memory dies 712, and/or additional electrical components (e.g., the capacitor and/or resistor 235 or similar electronic components).

As shown in example 702, when the load switch 502 is mounted in this manner, the narrow standoff (e.g., standoff 314 described in connection with the apparatus 300 shown in FIG. 3) is eliminated, thereby eliminating the voids 318 that may otherwise form between the load switch 402 and the substrate 404. More particularly, the load switch 502 may include the pillar interconnects 512 spacing the load switch 502 a sufficient distance (in the z-axis direction) such that the large standoff 516 is formed, permitting the mold compound to penetrate the spacing between the load switch 502 and the substrate 504, thereby reducing the risk of incomplete mold fill. As a result, the load switch 502 may be affixed to the substrate 504 (e.g., affixed to the solder mask 508 of the substrate 504) via the mold compound, reducing the delamination risk and otherwise minimizing faulty operation of the load switch 502 and/or the semiconductor package 706.

In the example 704, the load switch 502 of the apparatus 500 may be external to a semiconductor package 714, which may be a memory package (e.g., memory device 200) or a similar semiconductor package. For example, the substrate 504 may be a PCB or similar board on which both the load switch 502 and the semiconductor package 714 are mounted, and via which the load switch 502 and the semiconductor package 714 are electrically coupled (e.g., via signal traces or similar electrical connections in the PCB). As shown in example 704, due to the increased standoff between the load switch 502 and the substrate 504 as a result of the pillar interconnects 512, the load switch 502 may be underfilled with a filler material 716, which may be an MUF material, a capillary underfill material (e.g., an epoxy underfill), or a similar filler material. This may result in the load switch 502 being affixed to the substrate 504 (e.g., affixed to the solder mask 508 of the substrate 504) via the filler material 716, which may exhibit increased mechanical strength as compared to a mechanical bond formed by the solder paste 312 described above in connection with the apparatus 300 of FIG. 3. In that regard, features of the apparatus 500 may reduce the delamination risk and otherwise minimize faulty operation of the load switch 502 and/or the semiconductor package 714 when the load switch 502 is mounted external to the semiconductor package 714.

As indicated above, FIG. 7 is provided as an example. Other examples may differ from what is described with regard to FIG. 7.

FIGS. 8A-8E are diagrams illustrating an example 800 of manufacturing a semiconductor device including a load switch. For example, the steps shown in FIGS. 8A-8E may correspond to an example of manufacturing the apparatus 400 described above in connection with FIGS. 4 and 6.

Figure 8A:
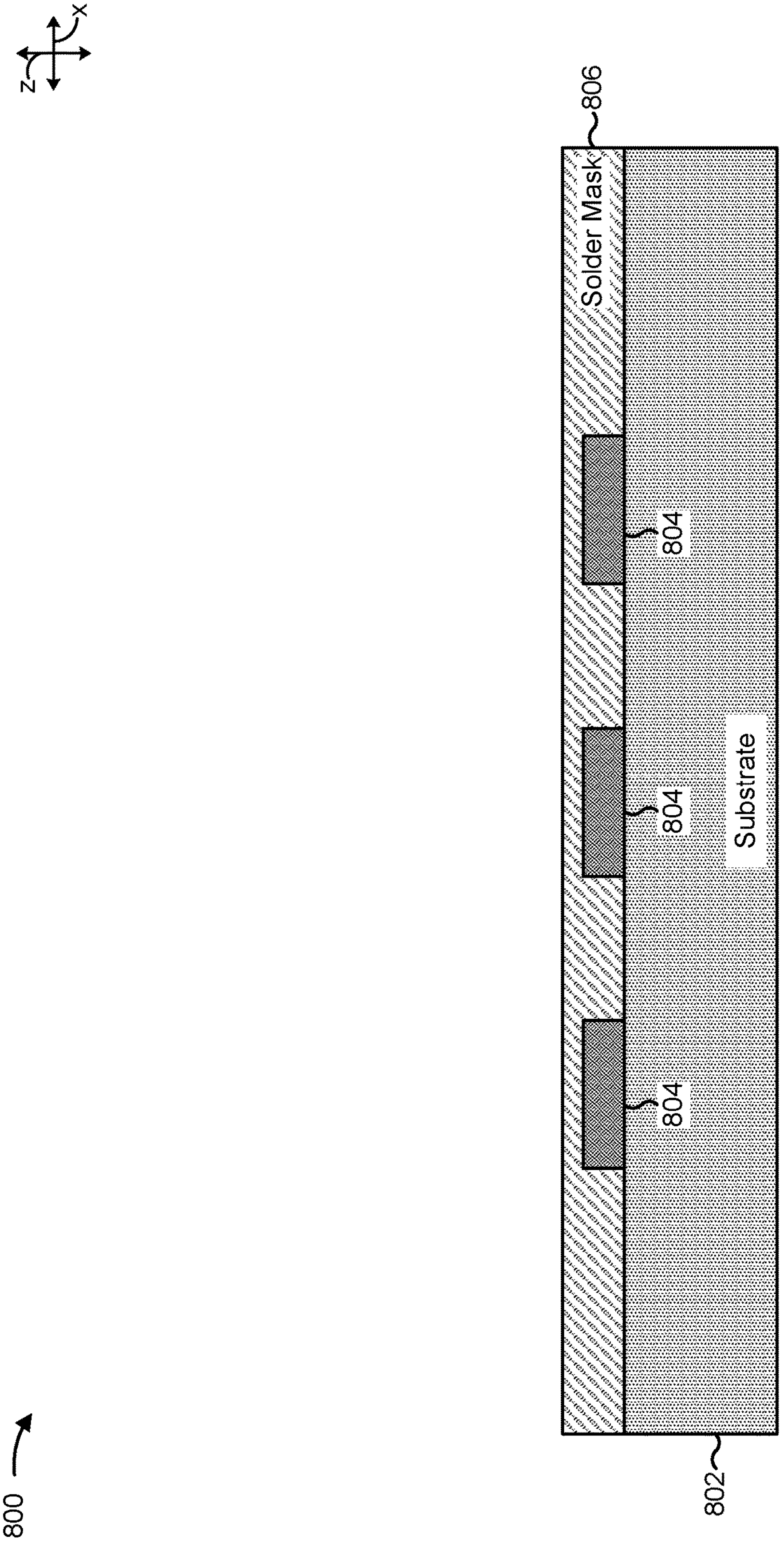
FIGS. 8A-8E are diagrams illustrating an example of manufacturing a semiconductor device including a load switch.
Figure 8B:
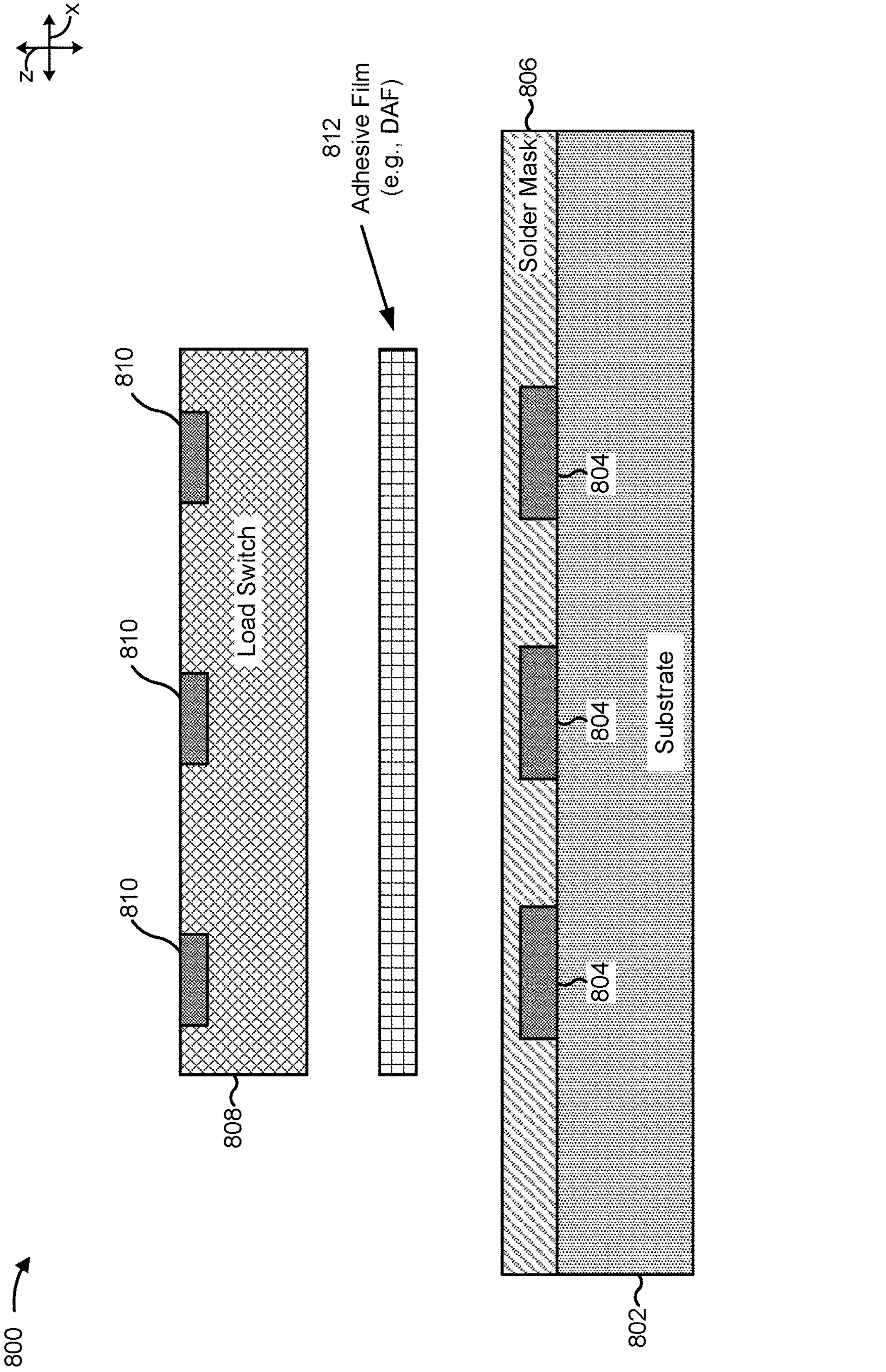

As shown in FIG. 8A, the example manufacturing process may include receiving a substrate 802 (e.g., substrate 404) that includes a plurality of first electrical contacts 804 (e.g., electrical contacts 406) and a solder mask 806 (e.g., solder mask 408) surrounding the plurality of first electrical contacts 804. As shown in FIG. 8B, the example manufacturing process may include receiving a load switch 808 (e.g., load switch 402) that includes a plurality of second electrical contacts 810 (e.g., electrical contacts 410). In some implementations, a quantity of the first electrical contacts 804 may correspond to a quantity of the second electrical contacts 810, such that each first electrical contact 804 may be coupled to a corresponding second electrical contact 810, as is described in more detail below in connection with FIG. 8D. Additionally, in some implementations, the example manufacturing process may include receiving an adhesive film 812 (e.g., adhesive layer 418). The adhesive film 812 may be a DAF or a similar type of adhesive film. In some aspects, the adhesive film 812 may be provided integral to the load switch 808. For example, the adhesive film 812 may be laminated onto the load switch 808 (e.g., on a surface of the load switch opposing a surface on which the plurality of electrical contacts 810 are provided) during a load switch manufacturing process, or the like.

Figure 8C:
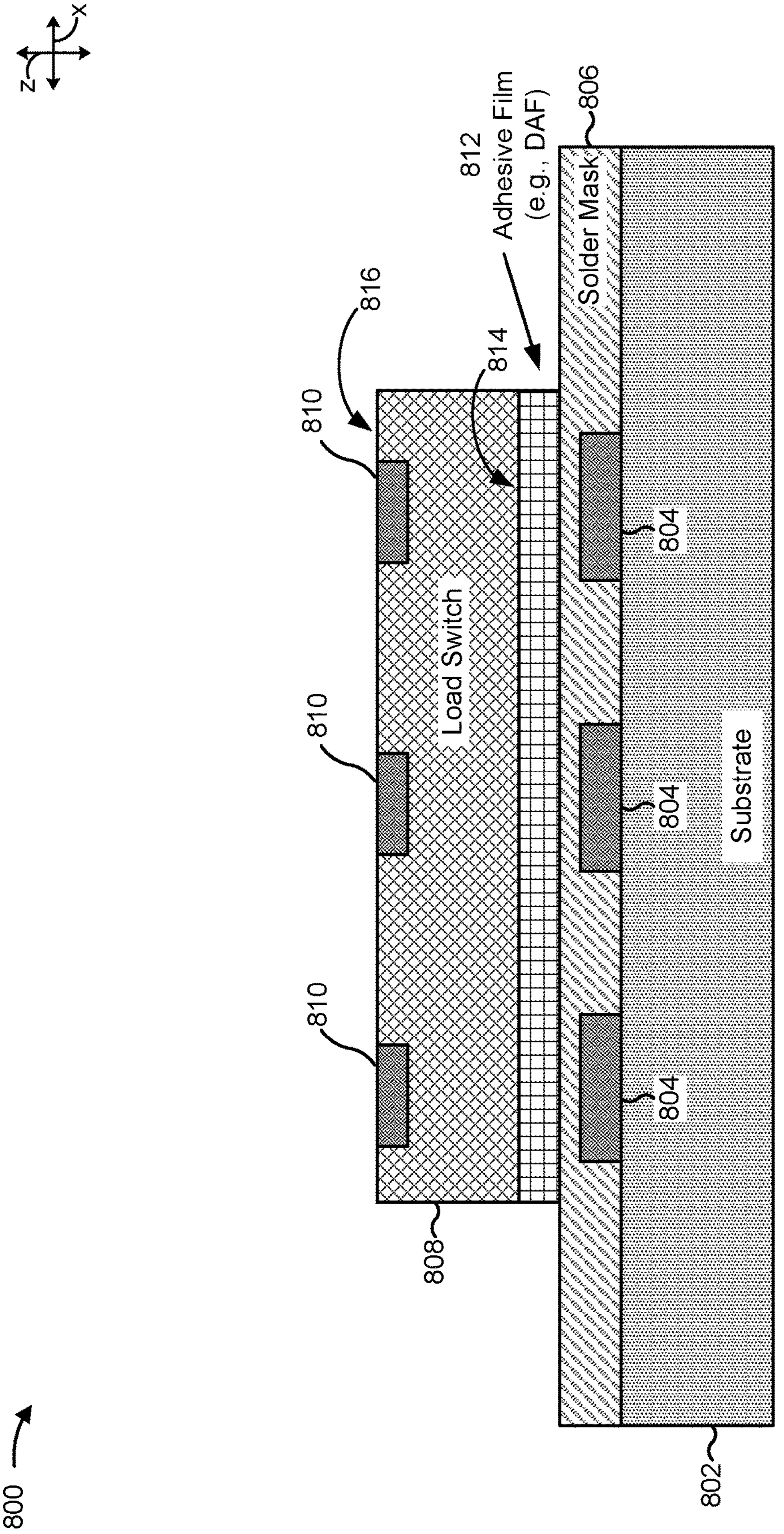

As shown in FIG. 8C, the example manufacturing process may include placing the load switch 808 on the substrate 802. Moreover, the example manufacturing process may include adhering the load switch 808 to the substrate 802 (and, more particularly, to the solder mask 806 of the substrate 802) using the adhesive film 812. In this regard, a standoff (e.g., standoff 314) between the load switch 808 and the substrate 802 (more particularly, between the load switch 808 and the solder mask 806 of the substrate 802) may be eliminated, as described above in connection with FIGS. 4 and 6. In some implementations, the example manufacturing process may include placing the load switch 808 upside down with respect to the orientation of the load switch 302 described above in connection with FIG. 3. More particularly, the example manufacturing process may include placing that load switch 808 on the substrate 802 such that a first outer surface 814 (e.g., first outer surface 412) faces the substrate 802 (e.g., such that the adhesive film 812 is sandwiched between the first outer surface 814 and the solder mask 806) and such that an opposing second outer surface 816 (e.g., second outer surface 414) faces away from the substrate 802, with the plurality of second electrical contacts 810 being disposed on the second outer surface 816 (e.g., such that the plurality of second electrical contacts 810 face away from the substrate 802).

Figure 8D:
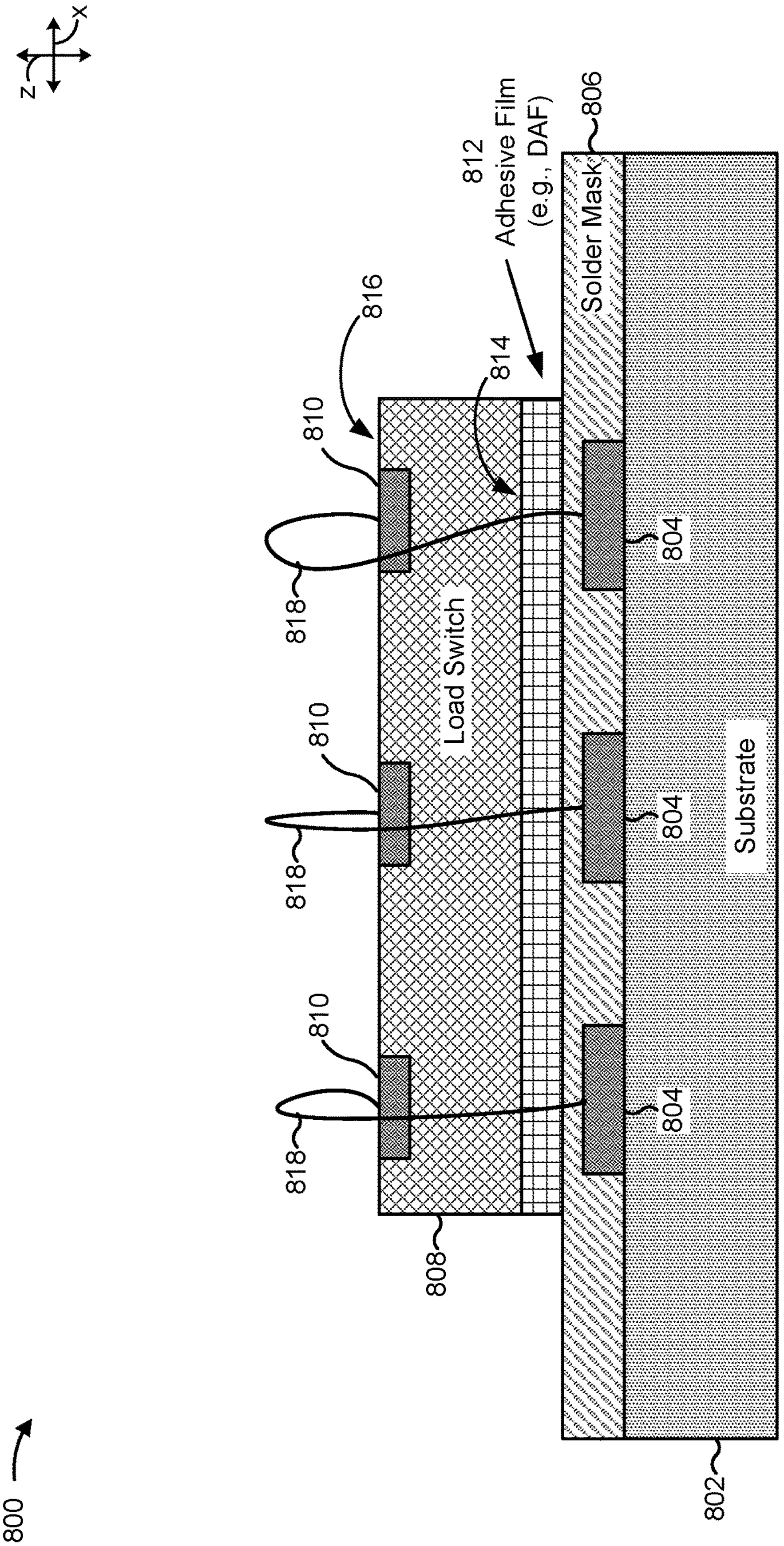

As shown in FIG. 8D, the example manufacturing process may include bonding the load switch 808 to the substrate 802 via a plurality of wire bonds 818 (e.g., wire bonds 416). More particularly, each wire bond 818 may electrically couple a corresponding first electrical contact 804 to a corresponding second electrical contact 810. Additionally, in some implementations (e.g., implementations in which the load switch 808 is external to a semiconductor package, such as the semiconductor package 606, the memory device 200, or a similar semiconductor package and/or memory package), the example manufacturing process may include electrically coupling the load switch to a semiconductor package, such as via traces or similar electrical connections provided in the substrate 802. More particularly, in some implementations, the example manufacturing process may include attaching a semiconductor package (e.g., semiconductor package 614) to the substrate 802 such that the load switch 808 is adhered to the substrate 802 external to the semiconductor package, and electrically coupling the load switch 808 to the semiconductor package (e.g., via the substrate 802 and/or traces included therein).

Figure 8E:
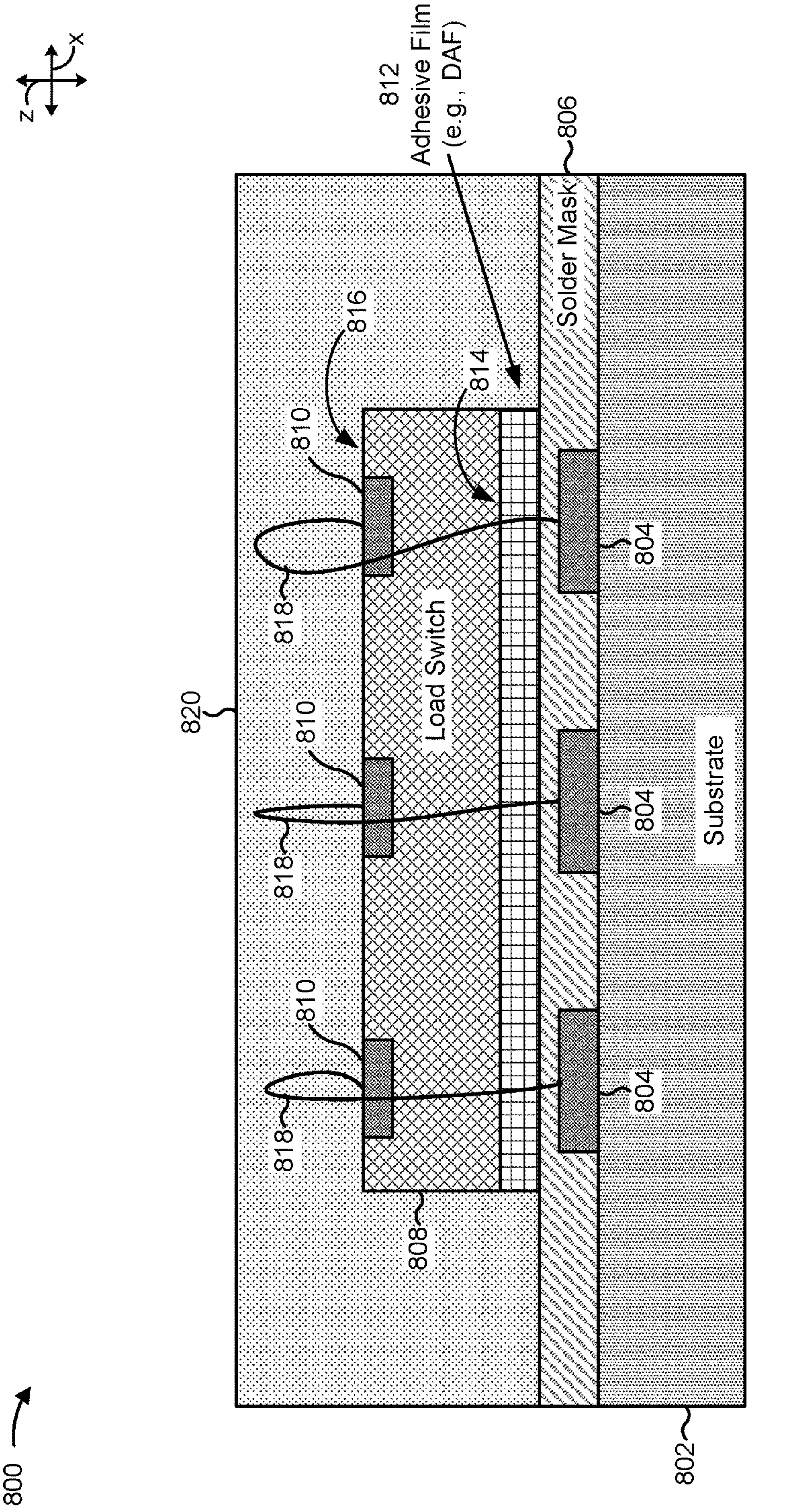

As shown in FIG. 8E, in some implementations (e.g., implementations in which the load switch 808 is internal to a semiconductor package, such as the semiconductor package 606, the memory device 200, or a similar semiconductor package and/or memory package), the example manufacturing process may include encapsulating (e.g., enclosing) the load switch 808 in a casing and/or a mold compound 820 (e.g., casing 608). For example, the load switch 808 may be encapsulated in the casing and/or the mold compound 820 via a compression molding process. Additionally, or alternatively, the example manufacturing process may include encapsulating additional electronic components in the casing and/or the mold compound 820. For example, in implementations in which the load switch 808 is internal to a memory package (e.g., memory device 200), the example manufacturing process may include encapsulating at least one of a controller (e.g., controller 610) or one or more semiconductor dies (e.g., memory dies 612) in the casing and/or the mold compound 820. Additionally, or alternatively, the example manufacturing process may include encapsulating one or more other electrical components in the casing and/or the mold compound 820, such as a capacitor and/or a resistor (e.g., capacitor and/or resistor 235) or a similar electrical component.

As indicated above, FIGS. 8A-8E are provided as an example. Other examples may differ from what is described with regard to FIGS. 8A-8E.

FIGS. 9A-9E are diagrams illustrating an example 900 of manufacturing a semiconductor device including a load switch. For example, the steps shown in FIGS. 9A-9E may correspond to an example of manufacturing the apparatus 500 described above in connection with FIGS. 5 and 7.

Figure 9A:
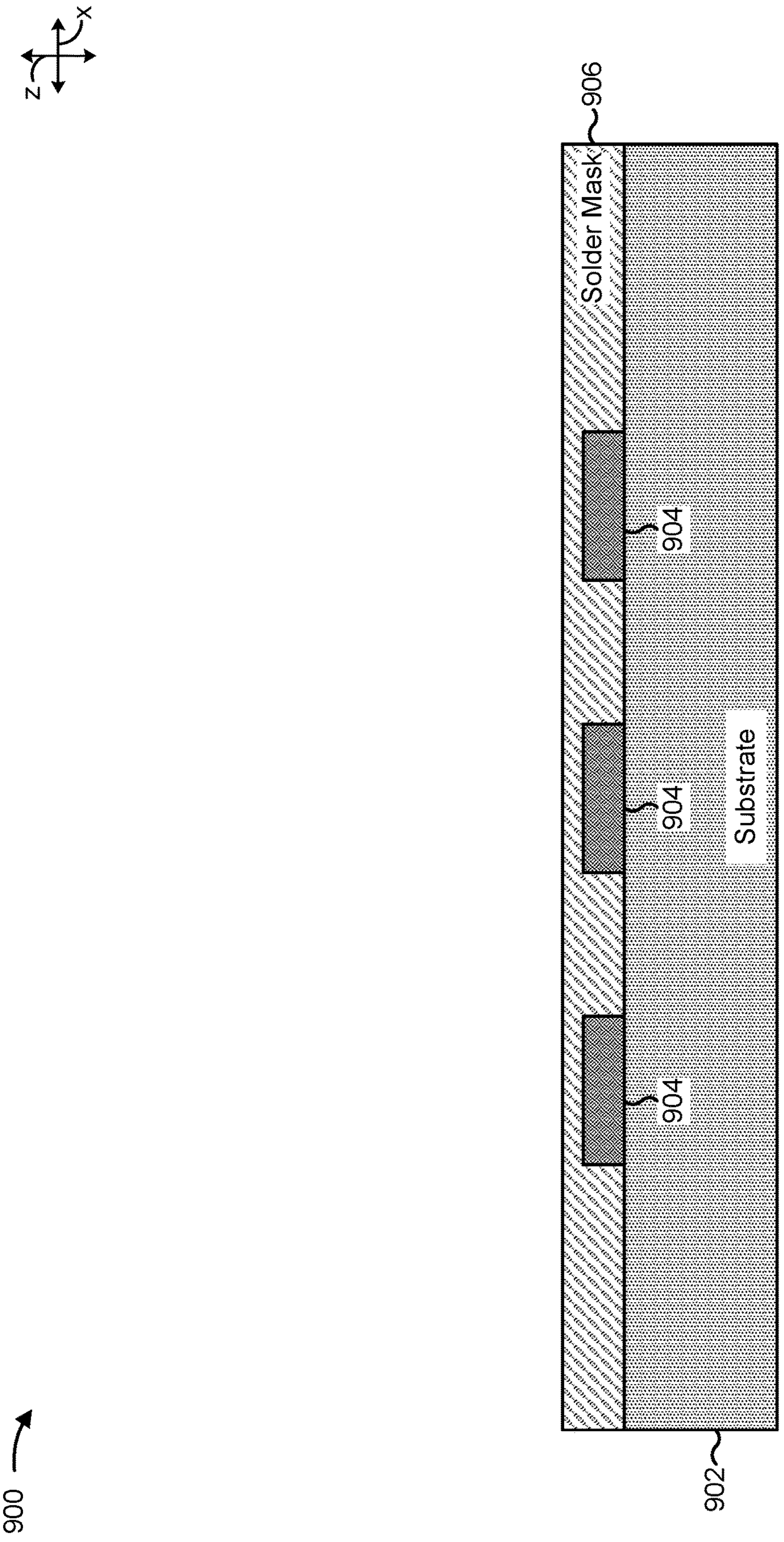
FIGS. 9A-9E are diagrams illustrating an example of manufacturing a semiconductor device including a load switch.
Figure 9B:
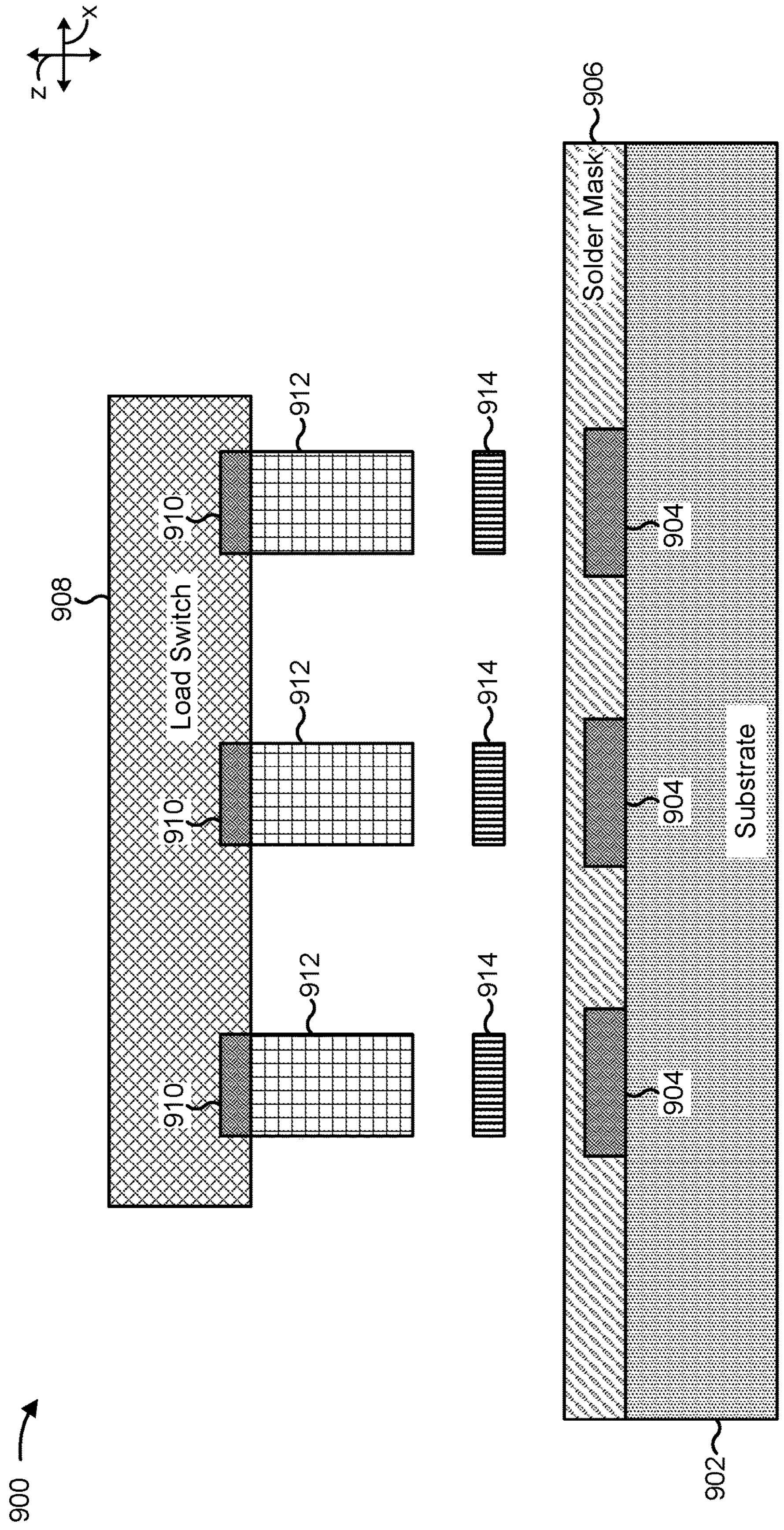

As shown in FIG. 9A, the example manufacturing process may include receiving a substrate 902 (e.g., substrate 504) that includes a plurality of first electrical contacts 904 (e.g., electrical contacts 506) and a solder mask 906 (e.g., solder mask 508) surrounding the plurality of first electrical contacts 904. As shown in FIG. 9B, the example manufacturing process may include receiving a load switch 908 (e.g., load switch 502) that includes a plurality of second electrical contacts 910 (e.g., electrical contacts 510). In some implementations, a quantity of the first electrical contacts 904 may correspond to a quantity of the second electrical contacts 910, such that each first electrical contact 904 may be coupled to a corresponding second electrical contact 910, as is described in more detail below in connection with FIG. 9C. Additionally, in some implementations, the load switch may include a plurality of pillar interconnects 912 (e.g., pillar interconnects 512). In some implementations, each pillar interconnect 512 may be bonded (e.g., soldered) to a corresponding one of the plurality of second electrical contacts 910, such as during a load switch 908 manufacturing process, and/or each pillar interconnect 512 may be integrally formed with a corresponding one of the plurality of second electrical contacts 910. Moreover, the example manufacturing process may include receiving solder paste 914 (e.g., solder paste 514) for bonding the plurality of pillar interconnects 912 to the plurality of first electrical contacts 904.

Figure 9C:
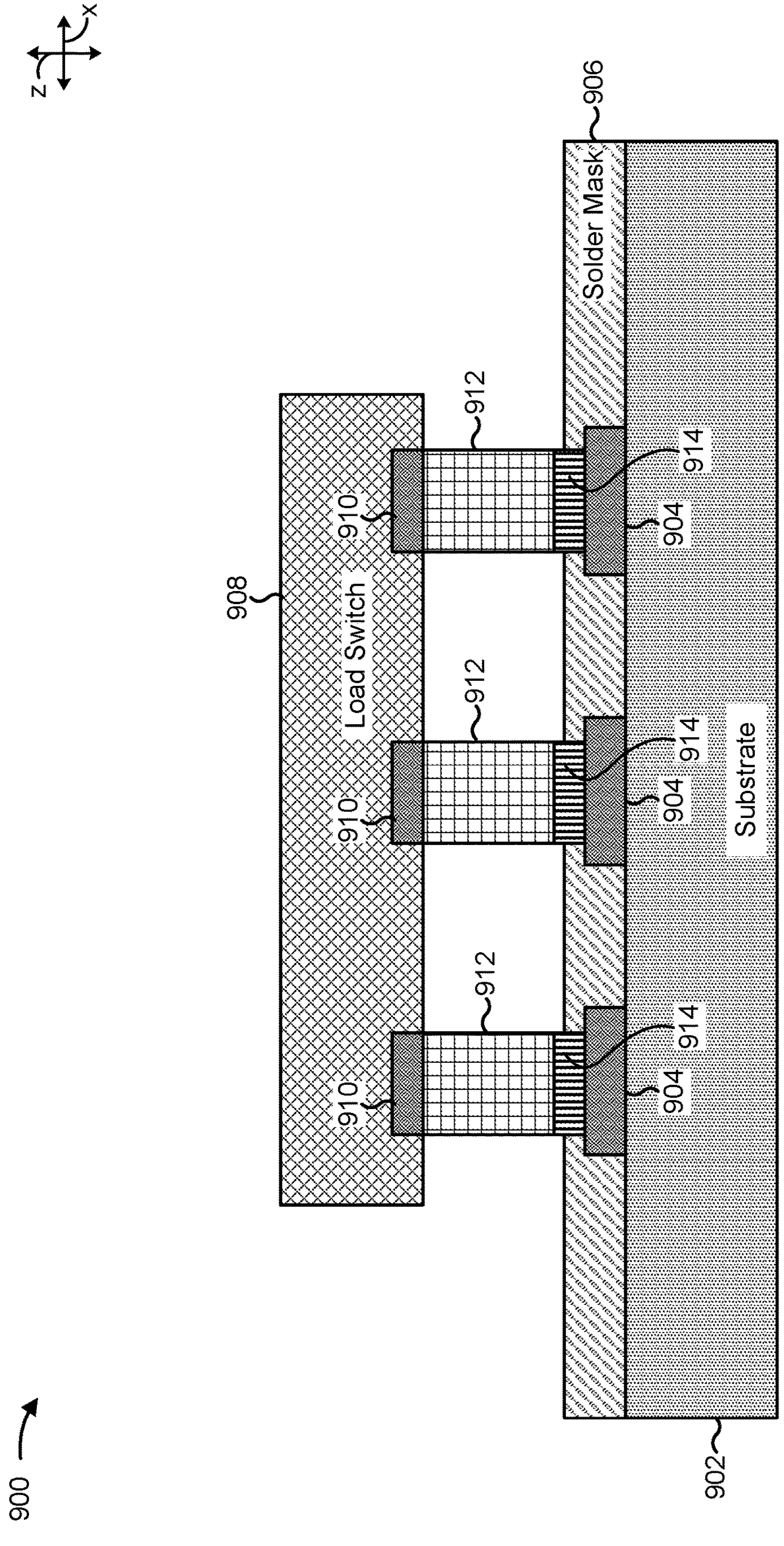

As shown in FIG. 9C, the example manufacturing process may include bonding the load switch 908 to the substrate 902 via the plurality of pillar interconnects 912 (e.g., via the solder paste 914), such that each pillar interconnect 912 electrically couples a corresponding first electrical contact 904 to a corresponding second electrical contact 910. This may result in a relatively large standoff (e.g., spacing, in the z-axis direction) between the substrate 902 and the load switch 908, as described above in connection with FIGS. 5 and 7, thereby reducing the risk of delamination and/or faulty load switch 908 performance.

Figure 9D:
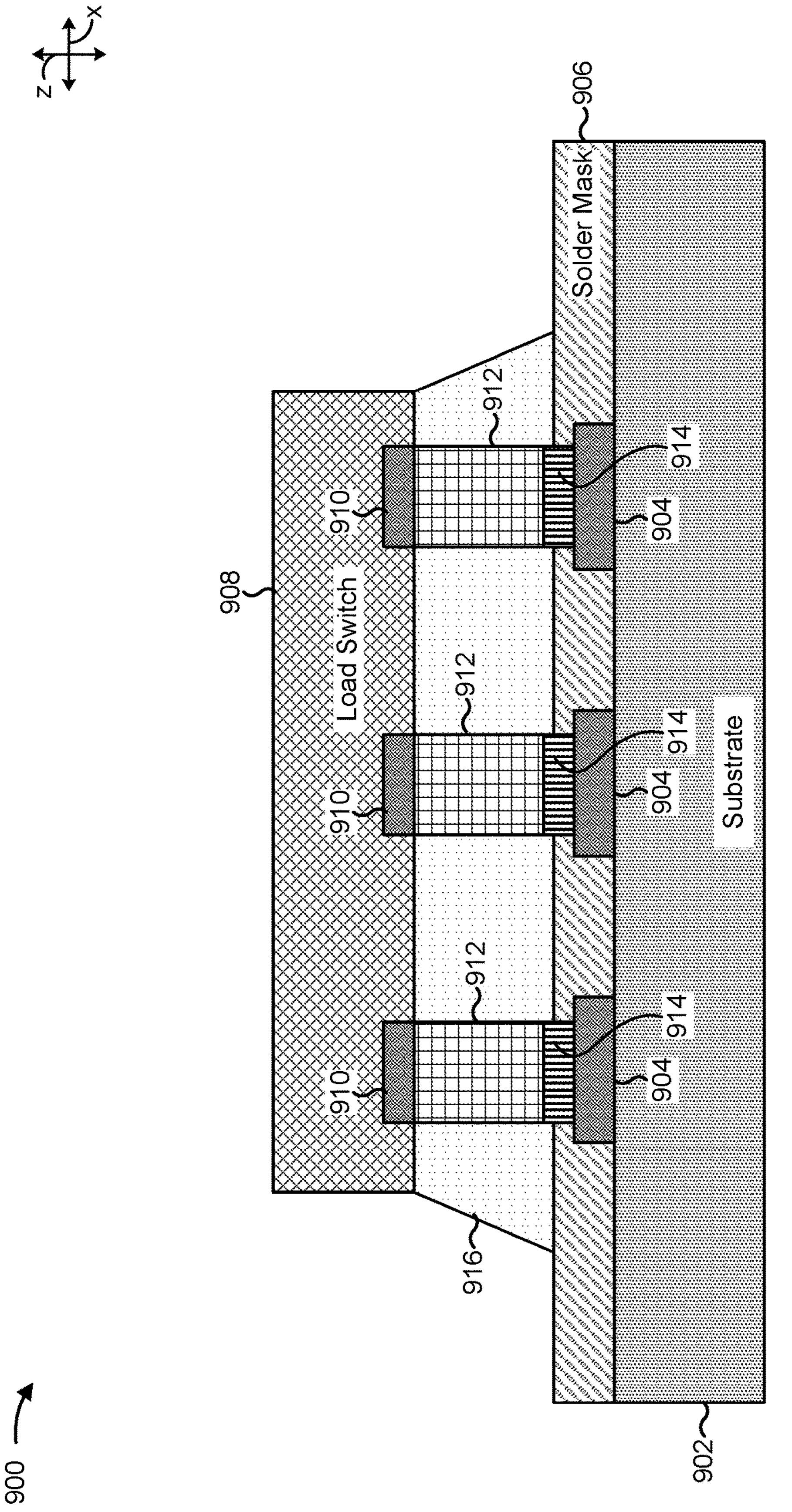

Additionally, in some implementations (e.g., implementations in which the load switch 908 is external to a semiconductor package, such as the semiconductor package 714, the memory device 200, or a similar semiconductor package and/or memory package), the example manufacturing process may include electrically coupling the load switch 908 to a semiconductor package, such as via traces or similar electrical connections provided in the substrate 902. More particularly, in some implementations, the example manufacturing process may include attaching a semiconductor package (e.g., semiconductor package 714) to the substrate 902 such that the load switch 908 is adhered to the substrate 902 external to the semiconductor package, and electrically coupling the load switch 908 to the semiconductor package (e.g., via the substrate 902 and/or traces included therein). In such implementations, and as shown in FIG. 9D, the example manufacturing process may include depositing a filler material 916 between the load switch 908 and the substrate 902, thereby encapsulating the plurality of pillar interconnects 912 in the filler material 916. In some implementations, the filler material may include at least one of a mold compound, an MUF, a capillary underfill (e.g., an epoxy underfill material), or a similar filler matter.

Figure 9E:
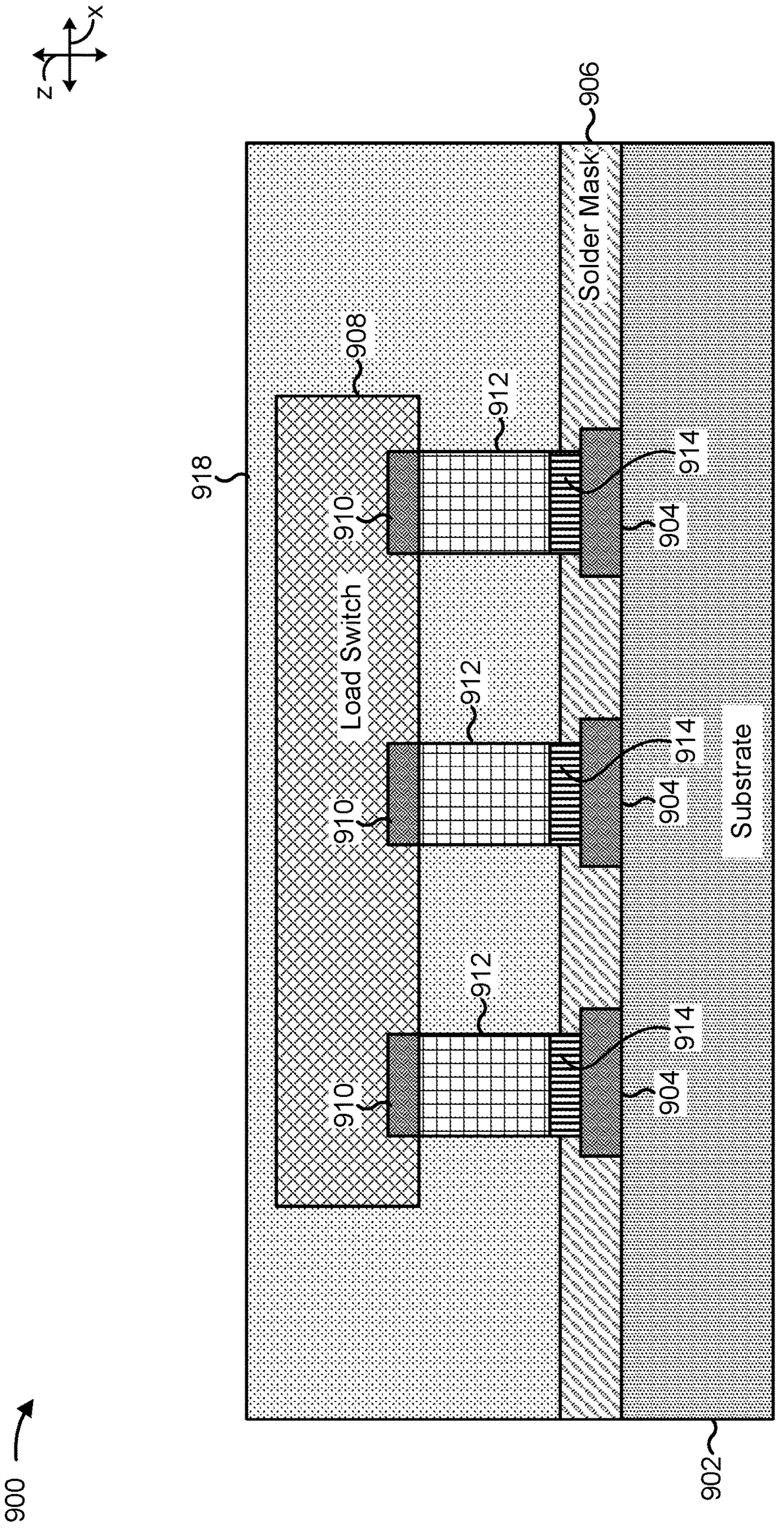

As shown in FIG. 9E, in some implementations (e.g., implementations in which the load switch 908 is internal to a semiconductor package, such as the semiconductor package 706, the memory device 200, or a similar semiconductor package and/or memory package), the example manufacturing process may include encapsulating (e.g., enclosing) the load switch 908 in a casing and/or a mold compound 918 (e.g., casing 708). For example, the load switch 908 may be encapsulated in the casing and/or the mold compound 918 via a compression molding process. Additionally, or alternatively, the example manufacturing process may include encapsulating additional electronic components in the casing and/or the mold compound 918. For example, in implementations in which the load switch 908 is internal to a memory package (e.g., memory device 200), the example manufacturing process may include encapsulating at least one of a controller (e.g., controller 710) or one or more semiconductor dies (e.g., memory dies 712) in the casing and/or the mold compound 918. Additionally, or alternatively, the example manufacturing process may include encapsulating one or more other electrical components in the casing and/or the mold compound 918, such as a capacitor and/or a resistor (e.g., capacitor and/or resistor 235) or a similar electrical component.

As indicated above, FIGS. 9A-9E are provided as an example. Other examples may differ from what is described with regard to FIGS. 9A-9D.

Figure 10:
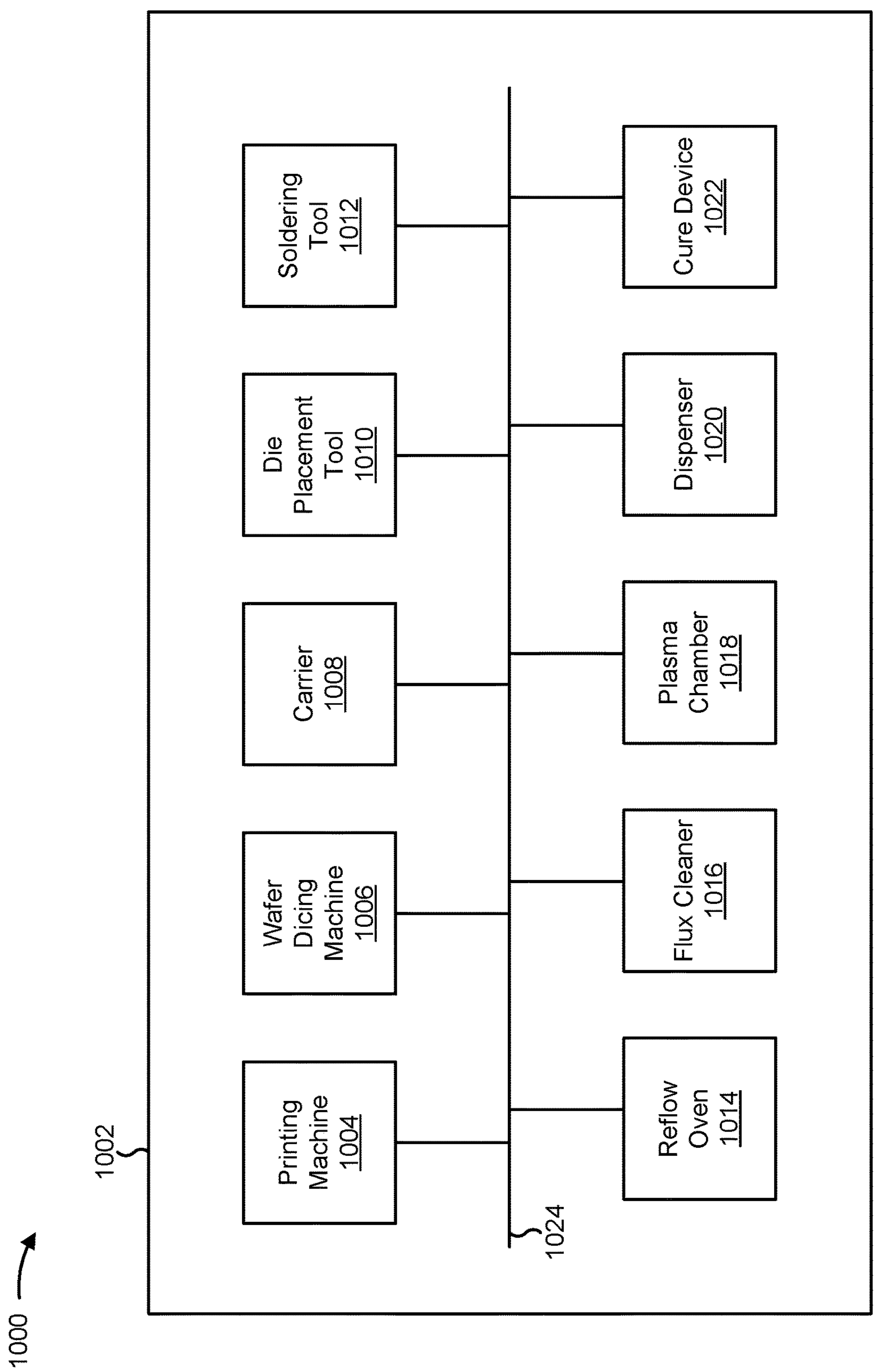
FIG. 10 is a diagram of example equipment used to manufacture various semiconductor packages, memory devices, or similar components described herein.

FIG. 10 is a diagram of example equipment 1000 used to manufacture various semiconductor packages, memory devices, or similar components described herein. In some implementations, the equipment 1000 may be used to manufacture apparatus 400, apparatus 500, and/or a memory package or other semiconductor package including apparatus 400 and/or apparatus 500 (as described above in connection with FIGS. 6-9E). As shown in FIG. 10, the equipment 1000 may include a packaging system 1002. The packaging system 1002 may include one or more devices or tooling, such as a printing machine 1004, a wafer dicing machine 1006, a carrier 1008, a die placement tool 1010, a soldering tool 1012, a reflow oven 1014, a flux cleaner 1016, a plasma chamber 1018, a dispenser 1020, and/or a cure device 1022. One or more devices may be may physically or communicatively coupled to one another. For example, one or more devices may interconnect via wired connections and/or wireless connections, such as via a bus 1024. Additionally, or alternatively, one or more devices may form part of an electronics assembly manufacturing line.

The printing machine 1004 may be a device capable of printing patterns in a material such as silicon, a dielectric material, or a similar material, for purposes of forming an integrated circuit or the like. In some implementations, the printing machine 1004 may be a lithography device capable of printing patterns in a material to form an integrated circuit. Additionally, or alternatively, the printing machine 1004 may be capable of applying solder or other electrically conductive material to form a portion of an electrical connection to be formed between a die and a substrate. For example, the printing machine 1004 may be capable of applying a grid of solder bumps to a die, which will align with a grid of bump pads on a substrate during a flip chip attachment process, or the like.

The wafer dicing machine 1006 may be a device capable of dicing a die, such as a microcontroller, a memory die, or other semiconductor die, from a wafer. In some implementations, the wafer dicing machine 1006 may include one or more blades and/or one or more lasers to dice a die from the wafer.

The carrier 1008 may be a device capable of supporting and/or carrying a substrate during a die and/or chip attachment process, during a compression molding process, or during a similar process. The carrier 1008 may be constructed from a non-contaminating material, such as quartz, glass, or a similar material, and may be capable of withstanding high temperatures. In that regard, the carrier 1008 may be capable of carrying a substrate and/or one or more die through one or more ovens, such as a reflow oven 1014 and/or a cure device 1022.

The die placement tool 1010 may be a high-precision tool capable of placing a die onto a substrate. In some implementations, the die placement tool 1012 may be capable of flipping a flip chip die during a placement process, such that an active surface of the flip chip die, which may be facing up during preliminary manufacturing steps, may face the substrate during the flip chip die placement process. In some implementations, the die placement tool 1010 may include one or more sensors capable of aligning bump bonds on a die with bond pads on a substrate during a flip chip die attachment process.

The soldering tool 1012 may be capable of forming one or more solder connections between components of a semiconductor package. For example, the soldering tool 1012 may be capable of forming wire bond connections between components of a semiconductor package by soldering wires connecting wire bond bands from one component to wire bond pads of another component. In some examples, the soldering tool 1012 may be capable of applying a solder paste to between electrical contacts of electronic components, such as between pillar interconnects provided on a load switch and corresponding electrical contacts provided on a substrate.

The reflow oven 1014 may be capable of heating components to a suitable temperature to cause a reflow of solder or other bonding material, thereby causing the solder or similar material to melt and make an electrical connection between two components.

The flux cleaner 1016 may be a device capable of removing residual flux from a soldering process. In some implementations, the flux cleaner 1016 may include a heater capable of removing residual flux through a heat treatment process. Additionally, or alternatively, the flux cleaner 1016 may include a nozzle or similar device capable of applying a cleaning agent to a component in order to remove residual flux therefrom.

The plasma chamber 1018 may be a device capable of providing plasma treatment to component. In some implementations, the plasma chamber 1018 may be capable of directly or indirectly applying a plasma stream to an area of a component, such as for purposes of preparing the area on the component for receiving an epoxy underfill, or the like.

The dispenser 1020 may be a device capable of dispensing a filler material around a die or similar component. In some implementations, the dispenser 1020 may be capable of dispensing a mold compound (e.g., an epoxy mold compound) during a compression molding process. In some implementations, the dispenser 1020 may include a dispensing needle capable of applying an epoxy underfill by capillary action under pressure, such as by dispensing underfill material around a periphery of a die and/or other electrical component (e.g., a load switch) such that the underfill material flows beneath the die and/or other electrical component and fills a space between the die and/or other electrical component and a substrate.

The cure device 1022 may be a device capable of curing a mold compound, such as an epoxy mold compound, an epoxy underfill material, an MUF, or a similar material. In some implementations, the cure device 1022 may be an oven configured to heat a mold compound to a suitable curing temperature. Additionally, or alternatively, the cure device 1022 may be capable of curing a mold compound via a chemical reaction, by the application of ultraviolet light, by the application of other radiation, or the like.

The number and arrangement of devices and networks shown in FIG. 10 are provided as an example. In practice, there may be additional devices, fewer devices, different devices, or differently arranged devices than those shown in FIG. 10. Furthermore, two or more devices shown in FIG. 10 may be implemented within a single device, or a single device shown in FIG. 10 may be implemented as multiple, distributed devices. Additionally, or alternatively, a set of devices (e.g., one or more devices) of equipment 1000 may perform one or more functions described as being performed by another set of devices of equipment 1000.

Figure 11:
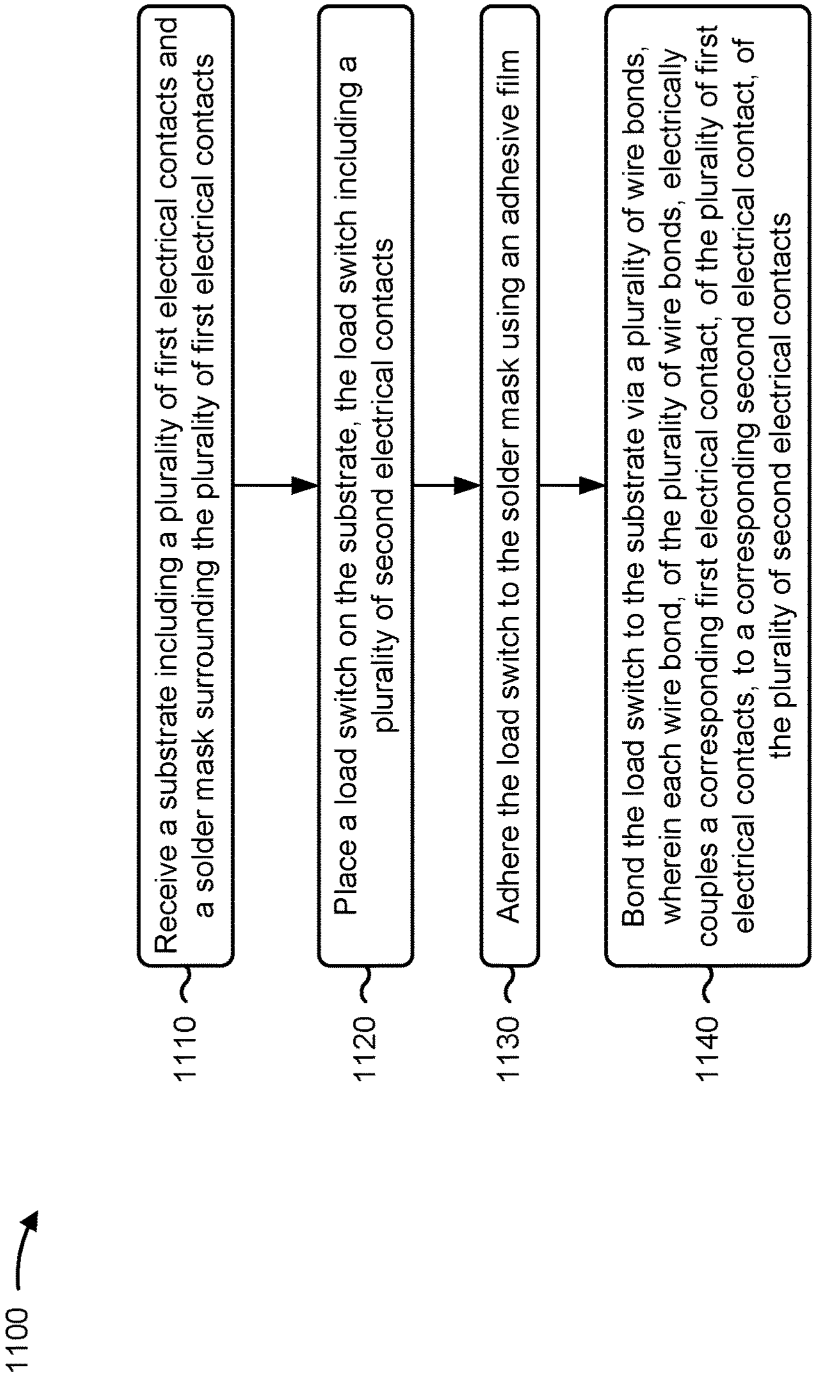
FIG. 11 is a flowchart of an example method of forming an integrated assembly or memory device having a load switch.

FIG. 11 is a flowchart of an example method 1100 of forming an integrated assembly or memory device having a load switch. In some implementations, one or more process blocks of FIG. 11 may be performed by various semiconductor manufacturing equipment, such as the example equipment 1000 described above in connection with FIG. 10.

As shown in FIG. 11, the method 1100 may include receiving a substrate including a plurality of first electrical contacts and a solder mask surrounding the plurality of first electrical contacts (block 1110). As further shown in FIG. 11, the method 1100 may include placing a load switch on the substrate, the load switch including a plurality of second electrical contacts (block 1120). As further shown in FIG. 11, the method 1100 may include adhering the load switch to the solder mask using an adhesive film (block 1130). As further shown in FIG. 11, the method 1100 may include bonding the load switch to the substrate via a plurality of wire bonds, wherein each wire bond, of the plurality of wire bonds, electrically couples a corresponding first electrical contact, of the plurality of first electrical contacts, to a corresponding second electrical contact, of the plurality of second electrical contacts (block 1140).

The method 1100 may include additional aspects, such as any single aspect or any combination of aspects described below and/or in connection with one or more other methods described elsewhere herein.

In a first aspect, adhering the load switch to the solder mask includes adhering the load switch to the solder mask using a die attach film.

In a second aspect, alone or in combination with the first aspect, the method 1100 includes encapsulating the load switch in a mold compound.

In a third aspect, alone or in combination with one or more of the first and second aspects, the method 1100 includes encapsulating at least one of a controller or one or more semiconductor dies in the mold compound.

In a fourth aspect, alone or in combination with one or more of the first through third aspects, the method 1100 includes enclosing the load switch in a casing.

In a fifth aspect, alone or in combination with one or more of the first through fourth aspects, the method 1100 includes enclosing at least one of a controller or one or more semiconductor dies in the casing.

In a sixth aspect, alone or in combination with one or more of the first through fifth aspects, the method 1100 includes attaching a semiconductor package to the substrate, wherein the load switch is adhered to the substrate external to the semiconductor package, and electrically coupling the load switch to the semiconductor package.

Although FIG. 11 shows example blocks of the method 1100, in some implementations, the method 1100 may include additional blocks, fewer blocks, different blocks, or differently arranged blocks than those depicted in FIG. 11. In some implementations, the method 1100 may include forming the apparatus 400, an integrated assembly that includes the apparatus 400, any part described herein of the apparatus 400, and/or any part described herein of an integrated assembly that includes the apparatus 400. For example, the method 1100 may include forming one or more of the parts 402-418, 606-614, and/or 802-820.

Figure 12:
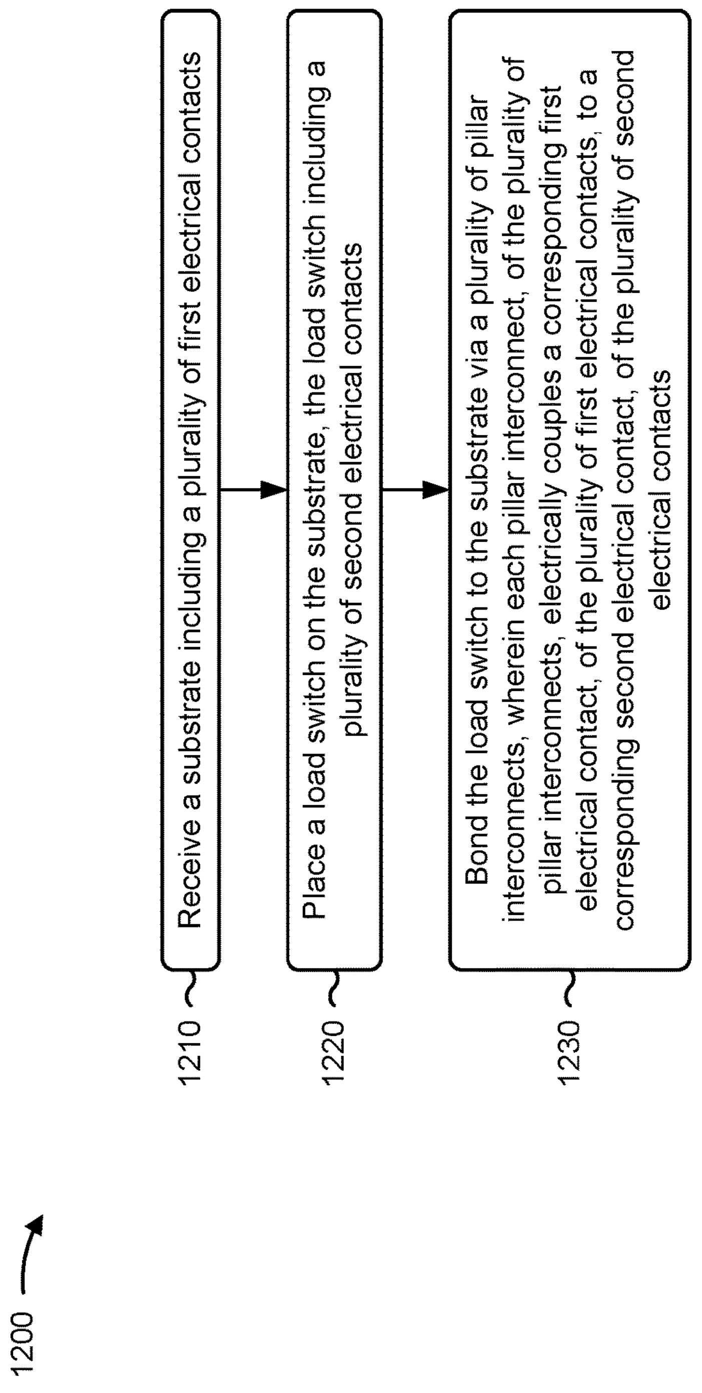
FIG. 12 is a flowchart of an example method of forming an integrated assembly or memory device having a load switch.

FIG. 12 is a flowchart of an example method 1200 of forming an integrated assembly or memory device having a load switch. In some implementations, one or more process blocks of FIG. 12 may be performed by various semiconductor manufacturing equipment, such as the example equipment 1000 described above in connection with FIG. 10.

As shown in FIG. 12, the method 1200 may include receiving a substrate including a plurality of first electrical contacts (block 1210). As further shown in FIG. 12, the method 1200 may include placing a load switch on the substrate, the load switch including a plurality of second electrical contacts (block 1220). As further shown in FIG. 12, the method 1200 may include bonding the load switch to the substrate via a plurality of pillar interconnects, wherein each pillar interconnect, of the plurality of pillar interconnects, electrically couples a corresponding first electrical contact, of the plurality of first electrical contacts, to a corresponding second electrical contact, of the plurality of second electrical contacts (block 1230).

The method 1200 may include additional aspects, such as any single aspect or any combination of aspects described below and/or in connection with one or more other methods described elsewhere herein.

In a first aspect, bonding the load switch to the substrate includes coupling the plurality of pillar interconnects to the plurality of first electrical contacts using a solder paste.

In a second aspect, alone or in combination with the first aspect, the method 1200 includes depositing a filler material between the load switch and the substrate, thereby encapsulating the plurality of pillar interconnects, wherein the filler material includes at least one of a mold compound, a mold underfill, or a capillary underfill.

In a third aspect, alone or in combination with one or more of the first and second aspects, the method 1200 includes encapsulating the load switch in a mold compound.

In a fourth aspect, alone or in combination with one or more of the first through third aspects, the method 1200 includes encapsulating at least one of a controller or one or more semiconductor dies in the mold compound.

In a fifth aspect, alone or in combination with one or more of the first through fourth aspects, the method 1200 includes enclosing the load switch in a casing.

In a sixth aspect, alone or in combination with one or more of the first through fifth aspects, the method 1200 includes enclosing at least one of a controller or one or more semiconductor dies in the casing.

In a seventh aspect, alone or in combination with one or more of the first through sixth aspects, the method 1200 includes attaching a semiconductor package to the substrate, wherein the load switch is bonded to the substrate external to the semiconductor package, and electrically coupling the load switch to the semiconductor package.

Although FIG. 12 shows example blocks of the method 1200, in some implementations, the method 1200 may include additional blocks, fewer blocks, different blocks, or differently arranged blocks than those depicted in FIG. 12. In some implementations, the method 1200 may include forming the apparatus 500, an integrated assembly that includes the apparatus 500, any part described herein of the apparatus 500, and/or any part described herein of an integrated assembly that includes the apparatus 500. For example, the method 1200 may include forming one or more of the parts 502-514, 706-714, and/or 902-918.

Figure 13:
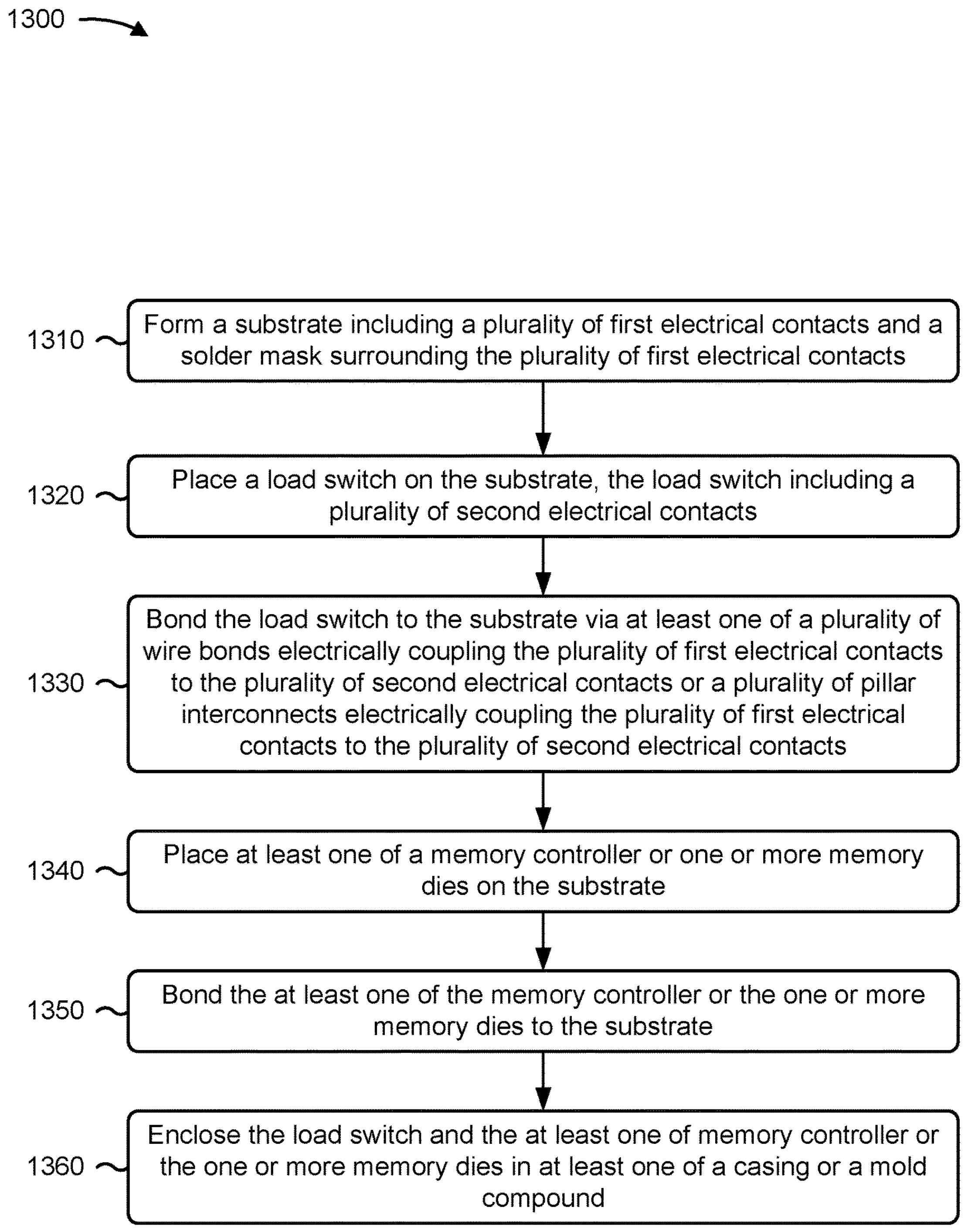
FIG. 13 is a flowchart of an example method of forming an integrated assembly or memory device having a load switch.

FIG. 13 is a flowchart of an example method 1300 of forming an integrated assembly or memory device having a load switch. In some implementations, one or more process blocks of FIG. 13 may be performed by various semiconductor manufacturing equipment, such as the example equipment 1000 described above in connection with FIG. 10.

As shown in FIG. 13, the method 1300 may include forming a substrate including a plurality of first electrical contacts and a solder mask surrounding the plurality of first electrical contacts (block 1310). As further shown in FIG. 13, the method 1300 may include placing a load switch on the substrate, the load switch including a plurality of second electrical contacts (block 1320). As further shown in FIG. 13, the method 1300 may include bonding the load switch to the substrate via at least one of a plurality of wire bonds electrically coupling the plurality of first electrical contacts to the plurality of second electrical contacts or a plurality of pillar interconnects electrically coupling the first electrical contacts to the plurality of second electrical contacts (block 1330). As further shown in FIG. 13, the method 1300 may include placing at least one of a memory controller or one or more memory dies on the substrate (block 1340). As further shown in FIG. 13, the method 1300 may include bonding the at least one of the memory controller or the one or more memory dies to the substrate (block 1350). As further shown in FIG. 13, the method 1300 may include enclosing the load switch and the at least one of memory controller or the one or more memory dies in at least one of a casing or a mold compound (block 1360).

The method 1300 may include additional aspects, such as any single aspect or any combination of aspects described below and/or in connection with one or more other methods described elsewhere herein.

Although FIG. 13 shows example blocks of the method 1300, in some implementations, the method 1300 may include additional blocks, fewer blocks, different blocks, or differently arranged blocks than those depicted in FIG. 13. In some implementations, the method 1300 may include forming the apparatus 400 and/or 500, an integrated assembly that includes the apparatus 400 and/or 500, any part described herein of the apparatus 400 and/or 500, and/or any part described herein of an integrated assembly that includes the apparatus 400 and/or 500. For example, the method 1100 may include forming one or more of the parts 402-418, 502-514, 606-614, 706-714, 802-820, and/or 902-918.

Figure 14:
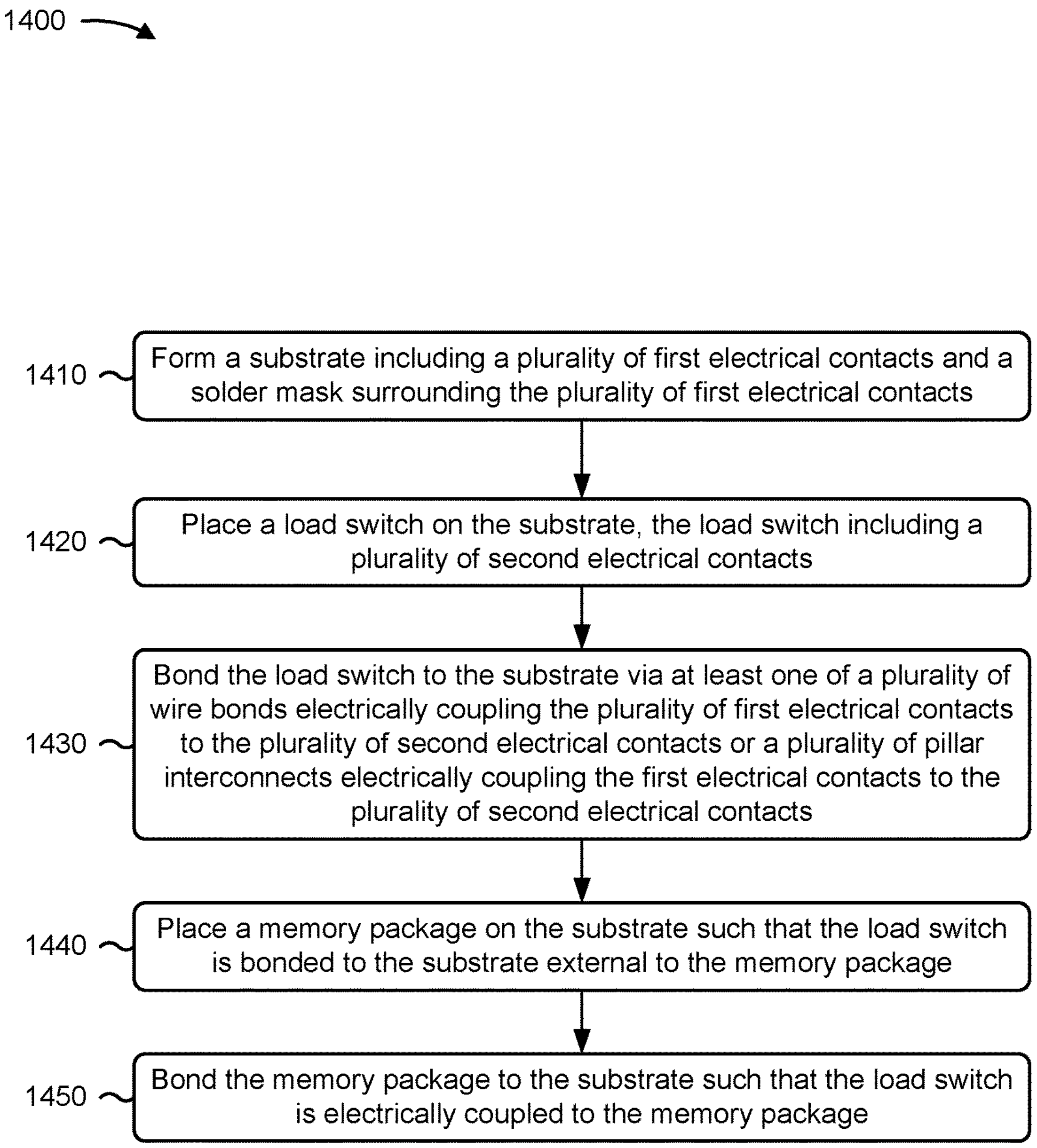
FIG. 14 is a flowchart of an example method of forming an integrated assembly or memory device having a load switch.

FIG. 14 is a flowchart of an example method 1400 of forming an integrated assembly or memory device having a load switch. In some implementations, one or more process blocks of FIG. 14 may be performed by various semiconductor manufacturing equipment, such as the example equipment 1000 described above in connection with FIG. 10.

As shown in FIG. 14, the method 1400 may include forming a substrate including a plurality of first electrical contacts and a solder mask surrounding the plurality of first electrical contacts (block 1410). As further shown in FIG. 14, the method 1400 may include placing a load switch on the substrate, the load switch including a plurality of second electrical contacts (block 1420). As further shown in FIG. 14, the method 1400 may include bonding the load switch to the substrate via at least one of a plurality of wire bonds electrically coupling the plurality of first electrical contacts to the plurality of second electrical contacts or a plurality of pillar interconnects electrically coupling the first electrical contacts to the plurality of second electrical contacts (block 1430). As further shown in FIG. 14, the method 1400 may include placing a memory package on the substrate such that the load switch is bonded to the substrate external to the memory package (block 1440). As further shown in FIG. 14, the method 1400 may include bonding the memory package to the substrate such that the load switch is electrically coupled to the memory package (block 1450).

The method 1400 may include additional aspects, such as any single aspect or any combination of aspects described below and/or in connection with one or more other methods described elsewhere herein.

Although FIG. 14 shows example blocks of the method 1400, in some implementations, the method 1400 may include additional blocks, fewer blocks, different blocks, or differently arranged blocks than those depicted in FIG. 14. In some implementations, the method 1400 may include forming the apparatus 400 and/or 500, an integrated assembly that includes the apparatus 400 and/or 500, any part described herein of the apparatus 400 and/or 500, and/or any part described herein of an integrated assembly that includes the apparatus 400 and/or 500. For example, the method 1100 may include forming one or more of the parts 402-418, 502-514, 606-614, 706-714, 802-820, and/or 902-918.

In some implementations, a semiconductor device assembly includes a substrate; a plurality of first electrical contacts disposed on the substrate; a load switch coupled to the substrate and including a first outer surface facing the substrate and an opposing second outer surface facing away from the substrate, wherein the load switch includes a plurality of second electrical contacts disposed on the second outer surface; and a plurality of wire bonds electrically coupling the load switch to the substrate, wherein each wire bond, of the plurality of wire bonds, electrically couples a corresponding first electrical contact, of the plurality of first electrical contacts, to a corresponding second electrical contact, of the plurality of second electrical contacts.

In some implementations, a semiconductor device assembly includes a substrate; a plurality of first electrical contacts disposed on the substrate; a load switch coupled to the substrate and including a plurality of second electrical contacts; and a plurality of pillar interconnects electrically coupling the load switch to the substrate, wherein each pillar interconnect, of the plurality of pillar interconnects, electrically couples a corresponding first electrical contact, of the plurality of first electrical contacts, to a corresponding second electrical contact, of the plurality of second electrical contacts.

In some implementations, a memory device comprising: a substrate including a plurality of first electrical contacts and a plurality of second electrical contacts; one or more memory dies electrically coupled to the substrate via the plurality of first electrical contacts; a load switch electrically coupled to the substrate via at least one of a plurality of wire bonds or a plurality of pillar interconnects; and at least one of a casing surrounding the one or more memory dies and the load switch or a mold compound encapsulating the at least one of the plurality of wire bonds or the plurality of pillar interconnects.

In some implementations, a method includes receiving a substrate including a plurality of first electrical contacts and a solder mask surrounding the plurality of first electrical contacts; placing a load switch on the substrate, the load switch including a plurality of second electrical contacts; adhering the load switch to the solder mask using an adhesive film; and bonding the load switch to the substrate via a plurality of wire bonds, wherein each wire bond, of the plurality of wire bonds, electrically couples a corresponding first electrical contact, of the plurality of first electrical contacts, to a corresponding second electrical contact, of the plurality of second electrical contacts.

In some implementations, a method includes receiving a substrate including a plurality of first electrical contacts; placing a load switch on the substrate, the load switch including a plurality of second electrical contacts; and bonding the load switch to the substrate via a plurality of pillar interconnects, wherein each pillar interconnect, of the plurality of pillar interconnects, electrically couples a corresponding first electrical contact, of the plurality of first electrical contacts, to a corresponding second electrical contact, of the plurality of second electrical contacts.

In some implementations, a method includes forming a substrate including a plurality of first electrical contacts and a solder mask surrounding the plurality of first electrical contacts; placing a load switch on the substrate, the load switch including a plurality of second electrical contacts; bonding the load switch to the substrate via at least one of a plurality of wire bonds electrically coupling the plurality of first electrical contacts to the plurality of second electrical contacts or a plurality of pillar interconnects electrically coupling the plurality of first electrical contacts to the plurality of second electrical contacts; placing at least one of a memory controller or one or more memory dies on the substrate; bonding the at least one of the memory controller or the one or more memory dies to the substrate; and enclosing the load switch and the at least one of memory controller or the one or more memory dies in at least one of a casing or a mold compound.

In some implementations, a method includes forming a substrate including a plurality of first electrical contacts and a solder mask surrounding the plurality of first electrical contacts; placing a load switch on the substrate, the load switch including a plurality of second electrical contacts; bonding the load switch to the substrate via at least one of a plurality of wire bonds electrically coupling the plurality of first electrical contacts to the plurality of second electrical contacts or a plurality of pillar interconnects electrically coupling the plurality of first electrical contacts to the plurality of second electrical contacts; placing a memory package on the substrate such that the load switch is bonded to the substrate external to the memory package; and bonding the memory package to the substrate such that the load switch is electrically coupled to the memory package.

The foregoing disclosure provides illustration and description but is not intended to be exhaustive or to limit the implementations to the precise forms disclosed. Modifications and variations may be made in light of the above disclosure or may be acquired from practice of the implementations described herein.

The orientations of the various elements in the figures are shown as examples, and the illustrated examples may be rotated relative to the depicted orientations. The descriptions provided herein, and the claims that follow, pertain to any structures that have the described relationships between various features, regardless of whether the structures are in the particular orientation of the drawings, or are rotated relative to such orientation. Similarly, spatially relative terms, such as "below," "beneath," "lower," "above," "upper," "middle," "left," and "right," are used herein for ease of description to describe one element's relationship to one or more other elements as illustrated in the figures. The spatially relative terms are intended to encompass different orientations of the element, structure, and/or assembly in use or operation in addition to the orientations depicted in the figures. A structure and/or assembly may be otherwise oriented (rotated 90 degrees or at other orientations), and the spatially relative descriptors used herein may be interpreted accordingly. Furthermore, the cross-sectional views in the figures only show features within the planes of the cross-sections, and do not show materials behind the planes of the cross-sections, unless indicated otherwise, in order to simplify the drawings. As used herein, the term "substantially" means "within reasonable tolerances of manufacturing and measurement."

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A semiconductor device assembly, comprising:
- a substrate;
- a plurality of first electrical contacts disposed on the substrate;
- a load switch coupled to the substrate and including a first outer surface facing the substrate and an opposing second outer surface facing away from the substrate, wherein the load switch includes a plurality of second electrical contacts disposed on the opposing second outer surface, and wherein the load switch is configured to selectively supply a current to one or more components; and
- a plurality of wire bonds electrically coupling the load switch to the substrate, wherein each wire bond, of the plurality of wire bonds, electrically couples a corresponding first electrical contact, of the plurality of first electrical contacts, to a corresponding second electrical contact, of the plurality of second electrical contacts.

2. The semiconductor device assembly of claim 1, further comprising an adhesive layer coupling the load switch to the substrate.

3. The semiconductor device assembly of claim 2, wherein the substrate includes a solder mask, and wherein the adhesive layer couples the load switch to the solder mask.

4. The semiconductor device assembly of claim 2, wherein the adhesive layer includes a die attach film.

5. The semiconductor device assembly of claim 1, wherein the load switch is internal to a memory package.

6. The semiconductor device assembly of claim 1, further comprising a memory package electrically coupled to the substrate, wherein the load switch is coupled to the substrate external to the memory package.

7. A semiconductor device assembly, comprising:
- a substrate;
- a plurality of first electrical contacts disposed on the substrate;
- a load switch coupled to the substrate and including a plurality of second electrical contacts, wherein the load switch is configured to control current flow within the semiconductor device assembly; and
- a plurality of pillar interconnects electrically coupling the load switch to the substrate, wherein each pillar interconnect, of the plurality of pillar interconnects, electrically couples a corresponding first electrical contact, of the plurality of first electrical contacts, to a corresponding second electrical contact, of the plurality of second electrical contacts.

8. The semiconductor device assembly of claim 7, further comprising solder paste coupling the plurality of pillar interconnects to the plurality of first electrical contacts.

9. The semiconductor device assembly of claim 7, further comprising a filler material disposed between the load switch and the substrate and encapsulating the plurality of pillar interconnects.

10. The semiconductor device assembly of claim 9, wherein the filler material includes at least one of a mold compound, a mold underfill, or a capillary underfill.

11. The semiconductor device assembly of claim 7, wherein the load switch is internal to a memory package.

12. The semiconductor device assembly of claim 7, further comprising a memory package electrically coupled to the substrate, wherein the load switch is coupled to the substrate external to the memory package.

13. A memory device comprising:

a substrate including a plurality of first electrical contacts and a plurality of second electrical contacts;

one or more memory dies electrically coupled to the substrate via the plurality of first electrical contacts;

a load switch electrically coupled to the substrate via at least one of a plurality of wire bonds or a plurality of pillar interconnects, and configured to turn on and off power supply rails of the memory device; and at least one of a casing surrounding the one or more memory dies and the load switch or a mold compound encapsulating the at least one of the plurality of wire bonds or the plurality of pillar interconnects.

14. The memory device of claim 13, wherein the load switch is electrically coupled to the substrate via the plurality of wire bonds, wherein the memory device further comprises an adhesive layer coupling the load switch to the substrate.

15. The memory device of claim 14, wherein the substrate includes a solder mask, and wherein the adhesive layer couples the load switch to the solder mask.

16. The memory device of claim 14, wherein the adhesive layer includes a die attach film.

17. The memory device of claim 13, wherein the load switch is electrically coupled to the substrate via the plurality of pillar interconnects, and wherein the memory device further comprises solder paste coupling the plurality of pillar interconnects to the plurality of first electrical contacts.

18. The memory device of claim 17, further comprising a filler material disposed between the load switch and the substrate and encapsulating the plurality of pillar interconnects.

19. The memory device of claim 18, wherein the filler material includes at least one of a mold compound, a mold underfill, or a capillary underfill.

20. The memory device of claim 13, further comprising a controller operatively connected to the one or more memory dies, wherein the at least one of the casing or the mold compound encloses the controller.

21. A method, comprising:

receiving a substrate including a plurality of first electrical contacts and a solder mask surrounding the plurality of first electrical contacts;

placing a load switch on the substrate, the load switch including a plurality of second electrical contacts, wherein the load switch is configured to selectively supply a current to one or more components;

adhering the load switch to the solder mask using an adhesive film; and bonding the load switch to the substrate via a plurality of wire bonds, wherein each wire bond, of the plurality of wire bonds, electrically couples a corresponding first electrical contact, of the plurality of first electrical contacts, to a corresponding second electrical contact, of the plurality of second electrical contacts.

22. The method of claim 21, wherein adhering the load switch to the solder mask includes adhering the load switch to the solder mask using a die attach film.

23. The method of claim 21, further comprising encapsulating the load switch in a mold compound.

24. The method of claim 23, further comprising encapsulating at least one of a controller or one or more semiconductor dies in the mold compound.

25. The method of claim 21, further comprising enclosing the load switch in a casing.

26. The method of claim 25, further comprising enclosing at least one of a controller or one or more semiconductor dies in the casing.

27. The method of claim 21, further comprising:

attaching a semiconductor package to the substrate, wherein the load switch is adhered to the substrate external to the semiconductor package; and electrically coupling the load switch to the semiconductor package.

28. A method, comprising:

receiving a substrate including a plurality of first electrical contacts;

placing a load switch on the substrate, the load switch including a plurality of second electrical contacts; and bonding the load switch to the substrate via a plurality of pillar interconnects, wherein each pillar interconnect, of the plurality of pillar interconnects, electrically couples a corresponding first electrical contact, of the plurality of first electrical contacts, to a corresponding second electrical contact, of the plurality of second electrical contacts.

29. The method of claim 28, wherein bonding the load switch to the substrate includes coupling the plurality of pillar interconnects to the plurality of first electrical contacts using a solder paste.

30. The method of claim 28, further comprising depositing a filler material between the load switch and the substrate, thereby encapsulating the plurality of pillar interconnects, wherein the filler material includes at least one of a mold compound, a mold underfill, or a capillary underfill.

31. The method of claim 28, further comprising encapsulating the load switch in a mold compound.

32. The method of claim 31, further comprising encapsulating at least one of a controller or one or more semiconductor dies in the mold compound.

33. The method of claim 28, further comprising enclosing the load switch in a casing.

34. The method of claim 33, further comprising enclosing at least one of a controller or one or more semiconductor dies in the casing.

35. The method of claim 28, further comprising:

attaching a semiconductor package to the substrate, wherein the load switch is bonded to the substrate external to the semiconductor package; and electrically coupling the load switch to the semiconductor package.

* * * * *